(12) United States Patent
Yoshikawa et al.

(10) Patent No.: US 10,679,826 B2
(45) Date of Patent: Jun. 9, 2020

(54) MICROWAVE CONTROL METHOD

(71) Applicant: TOKYO ELECTRON LIMITED, Tokyo (JP)

(72) Inventors: Jun Yoshikawa, Miyagi (JP); Naoki Matsumoto, Miyagi (JP); Kazushi Kaneko, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 414 days.

(21) Appl. No.: 15/646,290

(22) Filed: Jul. 11, 2017

(65) Prior Publication Data

US 2018/0019103 A1 Jan. 18, 2018

(30) Foreign Application Priority Data

Jul. 12, 2016 (JP) ................................ 2016-137460

(51) Int. Cl.
*B23K 10/00* (2006.01)
*H01J 37/32* (2006.01)
*H01J 37/244* (2006.01)

(52) U.S. Cl.
CPC ...... *H01J 37/32266* (2013.01); *H01J 37/244* (2013.01); *H01J 37/3222* (2013.01); *H01J 37/32201* (2013.01); *H01J 37/32229* (2013.01); *H01J 37/32238* (2013.01); *H01J 37/32256* (2013.01); *H01J 37/32311* (2013.01); *H01J 37/32935* (2013.01)

(58) Field of Classification Search
CPC ......... H01L 37/32266; H01L 37/32201; H01L 37/3222; H01L 37/3229; H01L 37/37256; H01L 37/37311; H01L 37/32953; H01J 37/244; H01J 37/32228; H05H 2001/46223; H05H 2001/463; H05H 2001/4607

USPC ............... 219/121.48, 121.43, 690, 695, 696
See application file for complete search history.

(56) References Cited

U.S. PATENT DOCUMENTS

| | | | | |
|---|---|---|---|---|
| 9,358,809 B2 * | 6/2016 | Biegelsen | ............. | B41J 11/002 |
| 2012/0160809 A1 * | 6/2012 | Ishibashi | ............... | C23C 16/511 |
| | | | | 216/69 |
| 2015/0214011 A1 * | 7/2015 | Kaneko | ................... | H05H 1/46 |
| | | | | 315/111.21 |

FOREIGN PATENT DOCUMENTS

JP  2015-22940 A  2/2015

* cited by examiner

*Primary Examiner* — Mark H Paschall
(74) *Attorney, Agent, or Firm* — Rothwell, Figg, Ernst & Manbeck, P.C.

(57) ABSTRACT

A microwave control method is used in a microwave plasma processing apparatus including a microwave generation unit, a waveguide for guiding a microwave generated by the microwave generation unit, a tuner for controlling a position of a movable short-circuiting plate, and a stub provided between the tuner and an antenna in the waveguide and insertable into an inner space of the waveguide. The method includes detecting the position of the movable short-circuiting plate controlled by the tuner for the microwave outputted by the microwave generation unit, determining whether or not a difference between a reference position and the detected position of the movable short-circuiting plate is within a tolerable range, and controlling an insertion length of the stub into the inner space of the waveguide when it is determined that the difference between the position of the movable short-circuiting plate and the reference position is not within the tolerable range.

8 Claims, 17 Drawing Sheets

MICROWAVE CONTROL METHOD

CROSS-REFERENCE TO RELATED APPLICATIONS

This application claims priority to Japanese Patent Application No. 2016-137460 filed on Jul. 12, 2016, the entire contents of which is incorporated herein by reference.

FIELD OF THE INVENTION

The disclosure relates to a microwave control method.

BACKGROUND OF THE INVENTION

A plasma processing apparatus is used in manufacturing electronic devices such as semiconductor devices and the like. A plasma processing apparatus disclosed in Japanese Patent Application Publication No. 2015-022940 is configured to excite a gas by using a microwave. This apparatus includes a microwave generation unit, an antenna, and a 4E tuner disposed in a waveguide between the microwave generation unit and the antenna. The 4E tuner has four movable short-circuiting plates. By operating the movable short-circuiting plates, impedance matching is automatically performed. Positions of the movable short-circuiting plates after the matching are referred to as tuner positions.

In the case of a plasma processing apparatus using a microwave such as the plasma processing apparatus disclosed in Japanese Patent Application Publication No. 2015-022940, a ceiling plate is consumed by use. In that case, an unstable plasma may be generated. The following is description of estimated mechanism of the generation of the unstable plasma. A resonance frequency exists between the tuner and the plasma. When the ceiling plate is consumed by use, the tuner position is moved. The resonance frequency is changed by the movement of the tuner position. When the changed resonance frequency coincides with a power frequency of a plasma, an unstable plasma is generated. When the unstable plasma is generated, a maintenance operation such as exchange of the ceiling plate or the like is required. Therefore, in this technical field, a microwave control method capable of improving availability of the plasma processing apparatus is required.

SUMMARY OF THE INVENTION

In accordance with an aspect, there is provided a microwave control method used in a microwave plasma processing apparatus including a microwave generation unit configured to generate a microwave having a power corresponding to a set power, a waveguide configured to guide the microwave generated by the microwave generation unit to an antenna of a chamber main body, a tuner provided in the waveguide and configured to control a position of a movable short-circuiting plate such that an impedance of the microwave generation unit side is matched with an impedance of the antenna side, and a stub provided between the tuner and the antenna in the waveguide and insertable into an inner space of the waveguide.

The microwave control method includes: a detection step of detecting the position of the movable short-circuiting plate which is controlled by the tuner for the microwave outputted by the microwave generation unit; a determination step of determining whether or not a difference between a reference position and the detected position of the movable short-circuiting plate is within a tolerable range; and a control step of controlling an insertion length of the stub into the inner space of the waveguide when it is determined that the difference between the position of the movable short-circuiting plate and the reference position is not within the tolerable range.

In this microwave control method, when the difference between the position of the movable short-circuiting plate and the reference position is not within the tolerable range, the insertion length of the stub provided between the tuner and the antenna (length of the stub inserted into the inner space of the waveguide) is controlled. In other words, when the tuner position is deviated from the tolerable range by the consumption of the ceiling plate, the insertion length of the stub is controlled. Accordingly, the resonance frequency between the tuner and the plasma can be changed, which makes it possible to avoid the generation of an unstable plasma. As a result, the availability of the plasma processing apparatus can be improved.

In the control step, the stub may be inserted into the inner space of the waveguide by a predetermined length, and the control step, the detection step, and the determination step are repeatedly executed until it is determined that the difference between the position of the movable short-circuiting position and the reference position is within the tolerable range in the determination step.

With this configuration, the tuner position can be within the tolerable range while checking the validity of the change.

The microwave generation unit may be configured to change a frequency of the microwave, and the microwave control method may further include: a change step of changing the insertion length of the stub to a threshold and changing the frequency of the microwave generated by the microwave generation unit when it is determined that the difference between the position of the movable short-circuiting plate and the reference position is not within the tolerable range and when the controlled insertion length of the stub which is not smaller than the threshold. Since the stub is inserted into the inner space of the waveguide, the reflection wave power may be increased by excessive insertion of the stub. In other words, when the insertion length of the stub exceeds the threshold value, the control using the stub has limitation. Therefore, in that case, the frequency of the microwave is changed by setting the insertion length of the stub to the threshold value. As such, when the control using the stub has limitation, it is possible to control the tuner position to be within the tolerable range by employing another approach in which the frequency of the microwave is changed.

The microwave control method may further include: a step of stopping the repeated execution of the control step, the detection step and the determination step and outputting alarm when it is determined that the difference between the position of the movable short-circuiting plate and the reference position is not within the tolerable range in the determination step and when the controlled insertion length of the stub is not smaller than the threshold. As such, when the control using the stub has limitation, the maintenance can be promoted by outputting alarm.

In accordance with another aspect, there is provided a microwave control method used in a microwave plasma processing apparatus including a microwave generation unit configured to generate a microwave having a power corresponding to a set power, a waveguide configured to guide the microwave generated by the microwave generation unit to an antenna of a chamber main body, a tuner provided in the waveguide and configured to control a position of a movable short-circuiting plate such that an impedance of the microwave generation unit side is matched with an impedance of the antenna side, and a stub provided between the tuner and the antenna in the waveguide and insertable into an inner space of the waveguide The microwave control method includes: a detection step of detecting a reflection wave power of the microwave outputted by the microwave generation unit; a determination step of determining whether or not a difference between a reference reflection wave power and the detected reflection wave power is within a tolerable range; and a control step of controlling an insertion length of the stub into the inner space of the waveguide when it is determined that the difference between the reference reflection wave power and the detected reflection wave power is not within the tolerable range.

In this microwave control method, when the difference between the reflection wave power and the reference reflection wave power is not within the tolerable range, the insertion length of the stub provided between the tuner and the antenna (length of insertion of the stub into the inner space of the waveguide) is controlled. In other words, when the reflection wave power is deviated from the tolerable range by the consumption of the ceiling plate, the insertion length of the stub is controlled. Accordingly, the resonance frequency between the tuner and the plasma can be changed, which makes it possible to avoid the generation of an unstable plasma. As a result, the availability of the plasma processing apparatus can be improved.

In the control step, the stub may be inserted into the inner space of the waveguide by a predetermined length and the control step, the detection step and the determination step may be repeatedly executed until it is determined that the difference between the reflection wave power and the reference reflection wave power is within the tolerable range in the determination step. With such configuration, the reflection wave power can be within the tolerable range while checking the validity of the change.

The microwave generation unit may be configured to change a frequency of the microwave, and the microwave control method may further include: a change step of changing the insertion length of the stub to a threshold and changing the frequency of the microwave generated by the microwave generation unit when it is determined that the difference between the position of the movable short-circuiting plate and the reference position is not within the tolerable range in the determination step and when the controlled insertion length of the stub is not smaller than the threshold.

Since the stub is inserted into the inner space of the waveguide, the reflection wave power may be increased by excessive insertion of the stub. In other words, when the insertion length of the stub exceeds the threshold, the control using the stub has limitation. Therefore, in that case, the frequency of the microwave is changed by setting the stub to the threshold. As such, when the control using the stub has limitation, it is possible to control the reflection wave power to be within the tolerable range by employing another approach in which the frequency of the microwave is changed.

The microwave control method may further include: a step of stopping the repeated execution of the control step, the detection step and the determination step and outputting alarm when it is determined that the difference between the position of the movable short-circuiting plate and the reference position is not within the tolerable range in the determination step and when the controlled insertion length of the stub is not smaller than the threshold. As such, when the control using the stub is limited, the maintenance can be promoted by outputting alarm.

As described above, the availability of the plasma processing apparatus can be improved.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Figure 1:
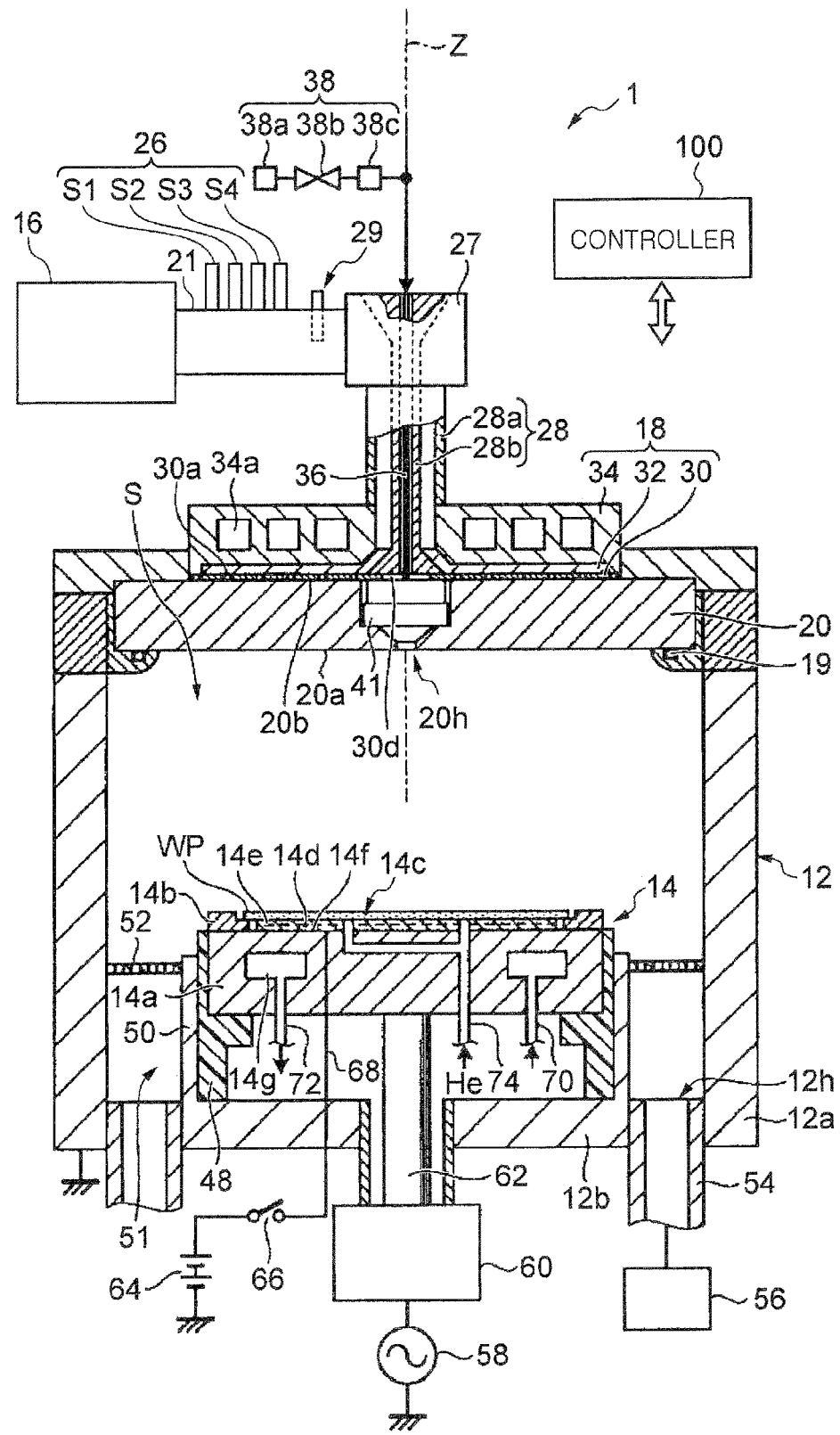
FIG. 1 shows a plasma processing apparatus to which a microwave control method according to a first embodiment is applied.

Hereinafter, various embodiments will be described with reference to the accompanying drawings. Like reference numerals will be used for like or corresponding parts throughout the drawings.

First Embodiment

FIG. 1 shows a plasma processing apparatus (microwave plasma processing apparatus) 1 to which a microwave control method according to a first embodiment is applied. The plasma processing apparatus 1 shown in FIG. 1 includes a chamber main body 12 and a microwave output device 16. The plasma processing apparatus 1 may further include a stage 14, an antenna 18 and a dielectric window 20.

The chamber main body 12 has therein a processing space S. The chamber main body 12 has a sidewall 12a and a bottom portion 12b. The sidewall 12a has a substantially cylindrical shape. A central axis of the sidewall 12a substantially coincides with an axis Z extending in a vertical direction. The bottom portion 12b is provided at a lower end side of the sidewall 12a. A gas exhaust opening 12h is provided at the bottom portion 12b. An upper end portion of the sidewall 12a is opened.

A dielectric window 20 is provided at the upper end portion of the sidewall 12a. The dielectric window 20 has a bottom surface 20a facing the processing space S. The dielectric window 20 blocks the opening formed at the upper end portion of the sidewall 12a. An O-ring 19 is provided between the dielectric window 20 and the upper end portion of the sidewall 12a. The chamber main body 12 is reliably sealed by the O-ring 19.

The stage 14 is accommodated in the processing space S. The stage 14 is disposed to face the dielectric window 20 in the vertical direction. The processing space S is provided between the dielectric window 20 and the stage 14. The stage 14 is configured to support a target object WP (e.g., wafer) mounted thereon.

In one embodiment, the stage 14 includes a base 14a and an electrostatic chuck 14c. The base 14a has a substantially disc shape and is made of a conductive material such as aluminum. A central axis of the base 14a substantially coincides with the axis Z. The base 14a is supported by a cylindrical support 48. The cylindrical support 48 is made of an insulating material and extends vertically upward from the bottom portion 12b. A conductive cylindrical supporting portion 50 is provided at an outer periphery of the cylindrical support 48. The cylindrical supporting portion 50 extends vertically upward from the bottom portion 12b of the chamber main body 12 along the outer periphery of the cylindrical support 48. An annular gas exhaust path 51 is formed between the cylindrical supporting portion 50 and the sidewall 12a.

A baffle plate 52 is provided at an upper portion of the gas exhaust path 51. The baffle plate 52 has an annular shape. The baffle plate 52 has a plurality of through-holes penetrating therethrough in a plate thickness direction. The above-described gas exhaust opening 12h is provided below the baffle plate 52. A gas exhaust unit 56 is connected to the gas exhaust opening 12h through a gas exhaust line 54. The gas exhaust unit 56 includes an APC (Automatic Pressure Control) valve and a vacuum pump such as a turbo molecular pump. A pressure in the processing space S can be reduced to a desired vacuum level by the gas exhaust unit 56.

The base 14a serves as a high frequency electrode. A high frequency power supply 58 for RF bias is electrically connected to the base 14a through a power feed rod 62 and a matching unit 60. The high frequency power supply 58 outputs a high frequency power having a frequency suitable for controlling energy of ions attracted to the target object WP, e.g., a high frequency of 13.65 MHz (hereinafter, referred to as "high frequency for bias") at a preset power level. The matching unit 60 has therein a matcher for matching an impedance of the high frequency power supply 58 and an impedance of a load side, mainly an electrode, a plasma and the chamber main body 12. The matcher includes a blocking capacitor for self-bias generation.

The electrostatic chuck 14c is provided on a top surface of the base 14a. The target object WP is attracted and held on the electrostatic chuck 14c by an electrostatic attractive force. The electrostatic chuck 14c includes an electrode 14d and insulating films 14e and 14f. Further, the electrostatic chuck 14c has a substantially disc shape. The central axis of the electrostatic chuck 14c substantially coincides with the axis Z. The electrode 14d of the electrostatic chuck 14c is formed of a conductive film and provided between the insulating films 14e and 14f. A DC power supply 64 is electrically connected to the electrode 14d through a switch 66 and a coated wire 68. The electrostatic chuck 14c can attract and hold the target object WP by a Coulomb force generated by a DC voltage applied from the DC power supply 64. A focus ring 14b is provided on the base 14a. The focus ring 14b is disposed to surround the target object WP and the electrostatic chuck 14c.

A coolant channel 14g is provided in the base 14a. The coolant channel 14g extends about, e.g., the axis Z. A coolant from a chiller unit is supplied into the coolant channel 14g through a line 70. The coolant supplied into the coolant channel 14g returns to the chiller unit through a line 72. By controlling a temperature of the coolant by the chiller unit, a temperature of the electrostatic chuck 14c and hence a temperature of the target object WP are controlled.

A gas supply line 74 is formed in the stage 14. The gas supply line 74 is provided to supply a heat transfer gas, e.g., He gas, to a gap between a top surface of the electrostatic chuck 14c and a backside of the target object WP.

The microwave output device 16 generates a microwave having a power corresponding to a set power. The microwave output device 16 outputs a microwave of a single frequency, i.e., a single peak SP, for exciting a processing gas supplied into the chamber main body 12. The microwave output device 16 is configured to variably control the frequency and the power of the microwave. In one example, the microwave output device 16 can control the power of the microwave within a range from 0 W to 5000 W and the frequency of the microwave within a range from 2400 MHz to 2500 MHz.

The plasma processing apparatus 1 further includes a waveguide 21, a tuner 26, a resonance frequency control unit 29, a mode transducer 27 and a coaxial waveguide 28. The waveguide 21 and the coaxial waveguide 28 guide the microwave generated by the microwave output device 16 to the antenna 18 of the chamber main body 12 which will be described later. An output unit of the microwave output device 16 is connected to one end of the waveguide 21. The other end of the waveguide 21 is connected to the mode transducer 27. The waveguide 21 is, e.g., a rectangular waveguide. The waveguide 21 is provided with the tuner 26. The tuner 26 has movable short-circuiting plates S1 to S4. Each of the movable short-circuiting plates S1 to S4 is configured to control a protruding amount thereof into the inner space of the waveguide 21. The tuner 26 controls protruding positions of the movable short-circuiting plates S1 to S4 with respect to a predetermined position as a reference position, thereby matching the impedance of the microwave output device 16 and the impedance of the load, e.g., the chamber main body 12.

The resonance frequency control unit 29 is provided between the tuner 26 in the waveguide (the waveguide 21 and the coaxial waveguide 28) and the antenna 18 to be described later. The resonance frequency control unit 29 has a stub that can be inserted into the inner space of the waveguide. The configuration of the resonance frequency control unit 29 will be described in detail later.

The mode transducer 27 converts a mode of the microwave from the waveguide 21 and supplies the microwave after the mode conversion to the coaxial waveguide 28. The coaxial waveguide 28 includes an outer conductor 28a and an inner conductor 28b. The outer conductor 28a has a substantially cylindrical shape and a central axis thereof substantially coincides with the axis Z. The inner conductor 28b has a substantially cylindrical shape and extends inside the outer conductor 28a. The central axis of the inner conductor 28b substantially coincides with the axis Z. The coaxial waveguide 28 transmits the microwave from the mode transducer 27 to the antenna 18.

The antenna 18 is provided on a surface 20b opposite to the bottom surface 20a of the dielectric window 20. The antenna 18 includes a slot plate 30, a dielectric plate 32 and a cooling jacket 34.

The slot plate 30 is provided on the surface 20b of the dielectric plate 20. The slot plate 30 is made of a conductive metal and has a substantially disc shape. A central axis of the slot plate 30 substantially coincides with the axis Z. The slot plate 30 has a plurality of slot openings 30a. In one example, the slot openings 30a form a plurality of slot pairs. Each of the slot pairs has two elongated slot openings 30a extending in directions intersecting each other. The slot pairs are arranged along one or more concentric circles about the axis Z. A through-hole 30d through which a conduit 36 to be described later can penetrate is formed at a central portion of the slot plate 30.

The dielectric plate 32 is provided on the slot plate 30. The dielectric plate 32 is made of a dielectric material such as quartz and has a substantially disc shape. A central axis of the dielectric plate 32 substantially coincides with the axis Z. The cooling jacket 34 is provided on the dielectric plate 32. The dielectric plate 32 is provided between the cooling jacket 34 and the slot plate 30.

The cooling jacket 34 has a conductive surface. A flow path 34a is formed in the cooling jacket 34. The coolant is supplied to the flow path 34a. The lower end of the outer conductor 28a is electrically connected to an upper surface of the cooling jacket 34. The lower end of the inner conductor 28b is electrically connected to the slot plate 30 through openings formed in a central portion of the cooling jacket 34 and the dielectric plate 32.

The microwave from the coaxial waveguide 28 propagates through the dielectric plate 32 and is supplied to the dielectric window 20 through the slot openings 30a. The microwave supplied to the dielectric window 20 is introduced into the processing space S.

The conduit 36 penetrates through the bore of the inner conductor 28b of the coaxial waveguide 28. As described above, the through-hole 30d through which the conduit 36 can penetrate is formed in the central portion of the slot plate 30. The conduit 36 extends through the bore of the inner conductor 28b and is connected to a gas supply system 38.

The gas supply system 38 supplies a processing gas for processing the target object WP to the conduit 36. The gas supply system 38 may include a gas source 38a, a valve 38b and a flow rate controller 38c. The gas source 38a is a source of the processing gas. The valve 38b switches start and stop of the supply of the processing gas from the gas source 38a. The flow rate controller 38c is, e.g., a mass flow controller, and controls a flow rate of the processing gas supplied from the gas source 38a.

The plasma processing apparatus 1 may further include an ejector 41. The ejector 41 supplies a gas from the conduit 36 to a through-hole 20h formed in the dielectric window 20. The gas supplied to the through-hole 20h of the dielectric window 20 is supplied to the processing space S. The processing gas is excited by the microwave introduced into the processing space S through the dielectric window 20. Accordingly, a plasma is generated in the processing space S and the target object WP is processed by active species such as ions and/or radicals from the plasma.

The plasma processing apparatus 1 further includes a controller 100. The controller 100 integrally controls the respective components of the plasma processing apparatus 1. The controller 100 may include a processor such as a CPU, a user interface, and a storage unit.

The processor executes a process recipe and a program stored in the storage unit to integrally control the respective components such as the microwave output device 16, the stage 14, the gas supply system 38, the gas exhaust unit 56 and the like. Further, the processor stores various measurement values and the like in the storage unit.

The user interface includes a keyboard or a touch panel through which a process manager inputs a command to manage the plasma processing apparatus 1, a display for visualizing and displaying an operation state of the plasma processing apparatus 1, and the like.

The storage unit stores a control program (software) for realizing various processes performed in the plasma processing apparatus 1 under the control of the processor, a process recipe including processing condition data and the like. The processor retrieves various control programs from the storage unit, if necessary, in response to an instruction from the user interface or the like, and executes the retrieved programs. A desired process is performed in the plasma processing apparatus 1 under the control of the processor. The storage unit may store a monitoring result in association with the executed process recipe (process condition). The monitoring result includes the tuner position and measurement values (to be described later) measured by the microwave output device 16, and the like.

Figure 2:
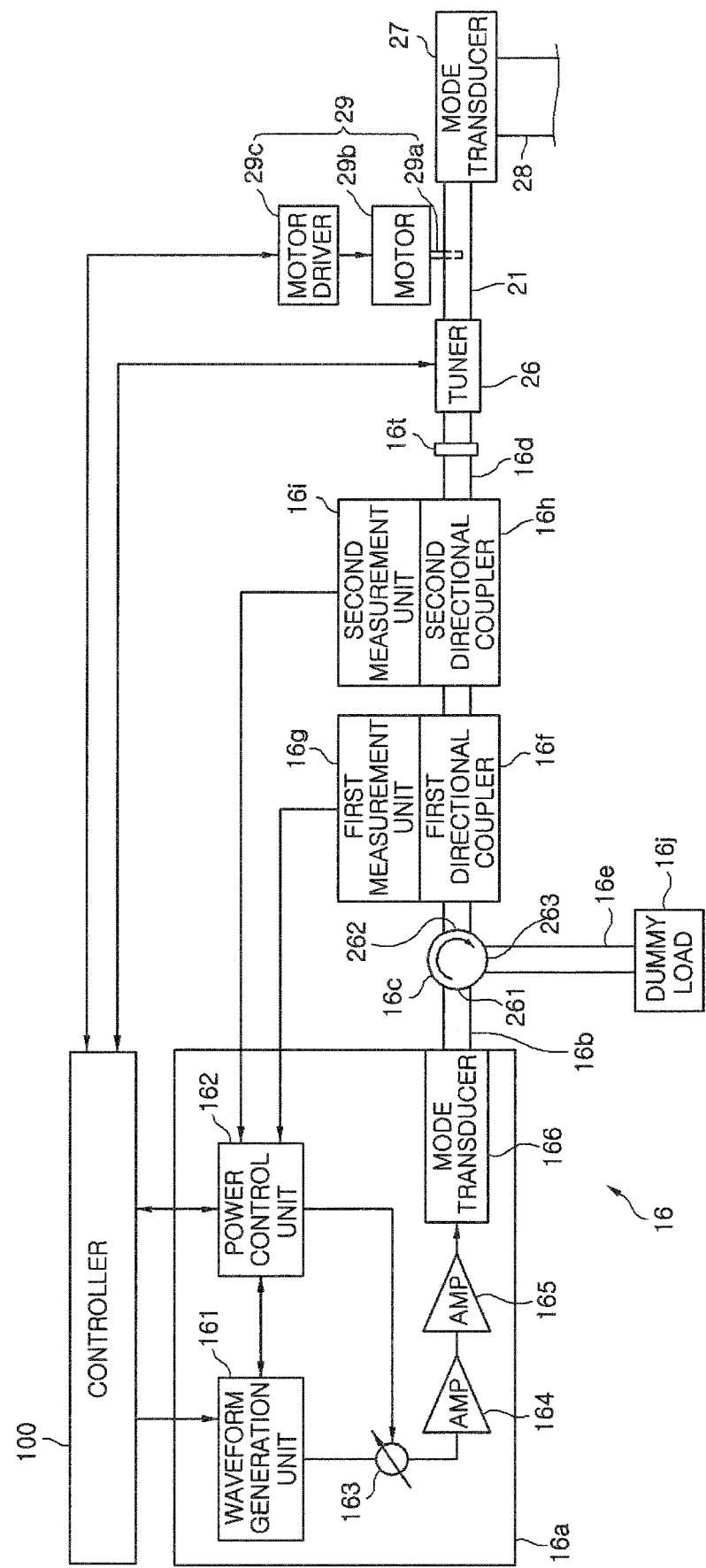
FIG. 2 shows a microwave output device, a tuner and a resonance frequency control unit.

Hereinafter, the microwave output device 16, the tuner and the resonance frequency control unit 29 will be described in detail. FIG. 2 shows the microwave output device 16, the tuner 26 and the resonance frequency control unit 29. The microwave output device 16 includes a microwave generation unit 16a, a waveguide 16b, a circulator 16c, waveguides 16d and 16e, a first directional coupler 16f, a first measurement unit 16g, a second directional coupler 16h, a second measurement unit 16i, and a dummy load 16j.

The microwave generation unit 16a includes a waveform generation unit 161, a power control unit 162, an attenuator 163, amplifiers 164 and 165, and a mode transducer 166. The waveform generation unit 161 generates a microwave. The waveform generation unit 161 is connected to the controller 100 and the power control unit 162. The waveform generation unit 161 generates a single peak microwave having a frequency corresponding to a set frequency specified by the controller 100. The waveform generation unit 161 has, e.g., a PLL (Phase Locked Loop) oscillator for generating a single peak microwave having a frequency corresponding to the set frequency.

The output of the waveform generation unit 161 is connected to the attenuator 163. The power control unit 162 is connected to the attenuator 163. The power control unit 162 may be, e.g., a processor. The power control unit 162 controls an attenuation rate of the microwave in the attenuator 163 such that the microwave having a power corresponding to a set power specified by the controller 100 is outputted from the microwave output device 16. The output of the attenuator 163 is connected to the mode transducer 166 through the amplifiers 164 and 165. The amplifiers 164 and 165 are configured to amplify the microwave at respective amplification factors. The mode transducer 166 is configured to convert a mode of the microwave outputted from the amplifier 165. The microwave generated by the mode conversion in the mode transducer 166 is outputted as an output microwave of the microwave generation unit 16a.

The output of the microwave generation unit 16a is connected to one end of the waveguide 16b. The other end of the waveguide 16b is connected to a first port 261 of the circulator 16c. The circulator 16c includes the first port 261, a second port 262 and a third port 263. The circulator 16c is configured to output a microwave inputted into the first port 261 from the second port 262 and output a microwave inputted into the second port 262 from the third port 263. One end of the waveguide 16d is connected to the second port 262 of the circulator 16c. The other end of the waveguide 16d serves as an output unit 16t of the microwave output device 16.

One end of the waveguide 16e is connected to the third port 263 of the circulator 16c. The other end of the waveguide 16e is connected to the dummy load 16j. The dummy load 16j is configured to receive and absorb a microwave propagating through the waveguide 16e. The dummy load 16j converts the microwave into heat, for example.

The first and the second directional coupler 16f and 16h are provided between one end and the other end of the waveguide 16d. The first directional coupler 16f is configured to branch a part of the microwave (i.e., traveling wave) outputted from the microwave generation unit 16a and propagating to the output unit 16t and output the part of the traveling wave. The first measurement unit 16g determines a first measurement value indicating a power of the traveling wave in the output unit 16t based on the part of the traveling wave outputted from the first directional coupler 16f.

The second directional coupler 16h is configured to branch a part of the microwave (i.e., reflection wave) returning to the output unit 16t and output the part of the reflection wave. The second measurement unit 16i determines a second measurement value indicating a power of the reflection wave (reflection wave power) in the output unit 16t based on the part of the reflection wave outputted from the second directional coupler 16h.

The first and the second measurement unit 16g and 16i are connected to the power control unit 162. The first measurement unit 16g outputs the first measurement value to the power control unit 162. The second measurement unit 16i outputs the second measurement value to the power control unit 162. The power control unit 162 controls the attenuator 163 such that a difference between the first measurement value and the second measurement value, i.e., a load power, coincides with the set power specified by the controller 100. If necessary, the power control unit 162 controls the waveform generation unit 161.

The tuner 26 controls the protruding positions of the movable short-circuiting plates S1 to S4 based on a signal of the controller 100 to match an impedance of the microwave output device 16 side and an impedance of the antenna 18 side. The tuner 26 operates the movable short-circuiting plates S1 to S4 by an actuator and a driver circuit (both not shown). The protruding positions of the movable short-circuiting plates after the matching are referred to as tuner positions.

The resonance frequency control unit 29 includes a stub 29a, a motor 29b and a motor driver 29c. The stub 29a is a member that can be inserted into the inner space of the waveguide. The stub 29a is, e.g., a cylindrical rod-shaped member. The stub 29a may be made of the same material as that of the waveguide or a metal. Such a material may be, e.g., bulk aluminum or bulk copper, or a metal alloy of brass or the like. The stub 29a may have a surface coated with a metal such as copper, gold or the like. An insertion direction of the stub 29a may be perpendicular to a traveling direction of the microwave. A protruding length of the stub 29a into the inner space of the waveguide is referred to as a stub insertion length. In other words, when one end of the stub 29a does not protrude into the inner space of the waveguide, the stub insertion length is zero. A motor 29b is provided at the other end of the stub 29a. The motor 29b is driven by a motor driver 29c and moves the stub 29a into the inner space of the waveguide. The motor driver 29c operates based on a signal of the controller 100.

Figure 3A:
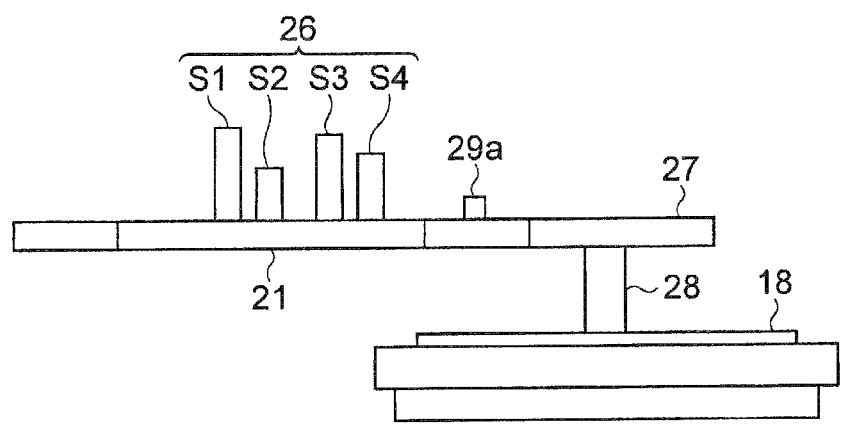
FIGS. 3A and 3B show positions of the resonance frequency control unit.
Figure 3B:
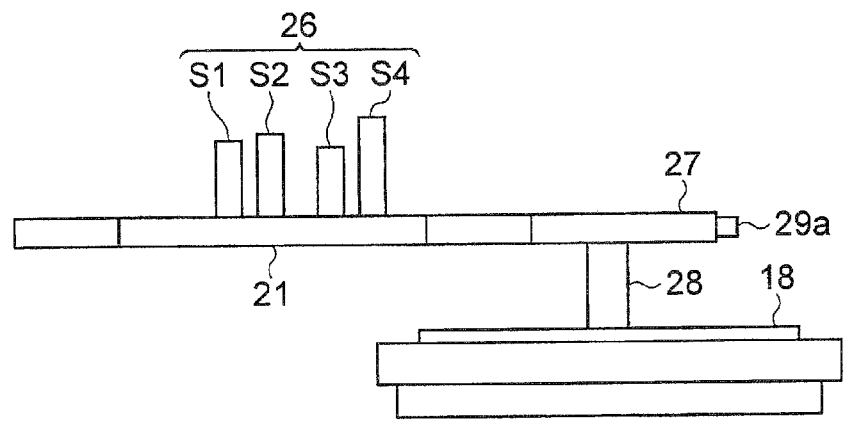

FIGS. 3A and 3B show positions of the resonance frequency control unit 29. The resonance frequency control unit 29 is provided between the antenna 18 and the tuner 26 in the waveguide. The resonance frequency control unit 29 may be provided in the waveguide 21 as can be seen from FIG. 3A or may be provided in the waveguide where the mode transducer 27 is disposed as can be seen from FIG. 3B. Or, the resonance frequency control unit 29 may be provided in the coaxial waveguide 28. The resonance frequency control unit 29 may be provided anywhere between the tuner 26 and the antenna 18.

Next, characteristics of the resonance frequency control unit 29 of the plasma processing apparatus 1 were examined by simulation. The simulation was performed under the following condition: the resonance frequency control unit 29 was arranged to a position shown in FIG. 3A (13 mm from a concentric center of the coaxial waveguide 28); a diameter of the stub was set to 20 mm; and a height of the inner space of the waveguide 21 was set to 27 mm. The relation between the resonance frequency and the reflection wave power was simulated on a stub insertion length basis. The relation between the resonance frequency and the reflection wave power was simulated while the stub insertion length was varied to 0 mm, 8 mm, 12 mm, 15 mm, 18 mm and 21 mm and an electron density ne was varied to $8.0 \times 10^{10}$ (1/cm$^3$), $9.0 \times 10^{10}$ (1/cm$^3$), $10 \times 10^{10}$ (1/cm$^3$) and $20 \times 10^{10}$ (1/cm$^3$).

Figure 4A:
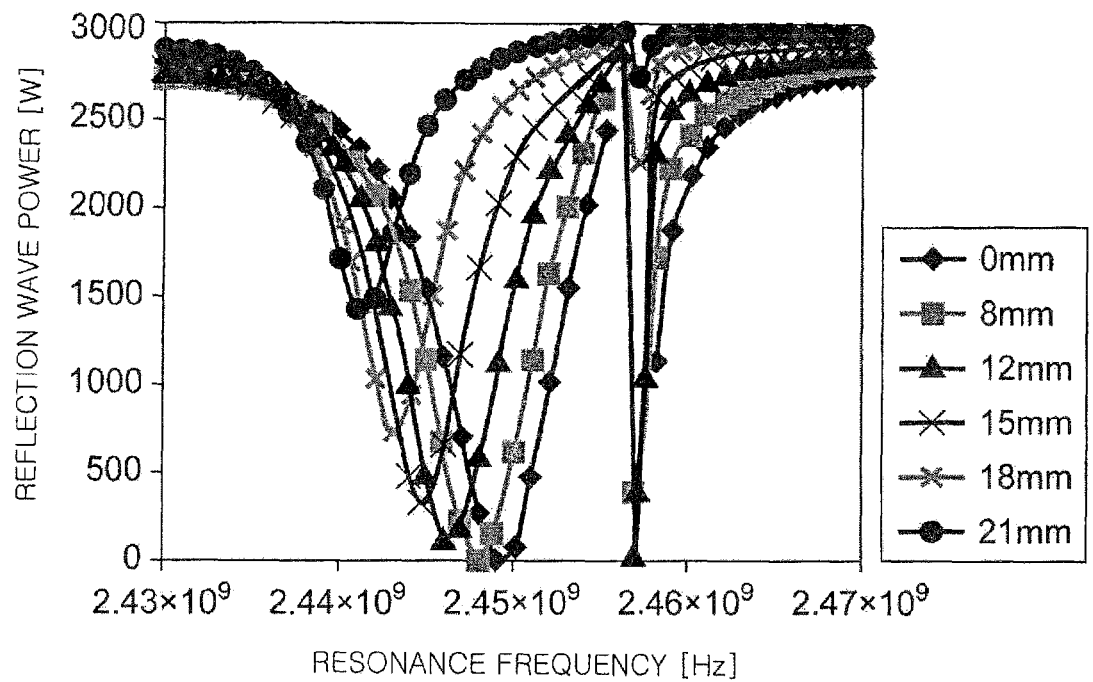
FIGS. 4A and 4B show results of simulating relation between a resonance frequency and a reflection wave power on a stub insertion length basis.

FIG. 4A shows a result of simulating the relation between the resonance frequency and the reflection wave power on a stub insertion basis at the electron density ne of $8.0 \times 10^{10}$ (1/cm$^3$). The vertical axis indicates the reflection wave power [W] and the horizontal axis indicates the resonance frequency [Hz]. As can be seen from FIG. 4A, as the stub insertion length is increased, the resonance frequency at which the reflection wave power becomes minimum is shifted to the left side.

Figure 4B:
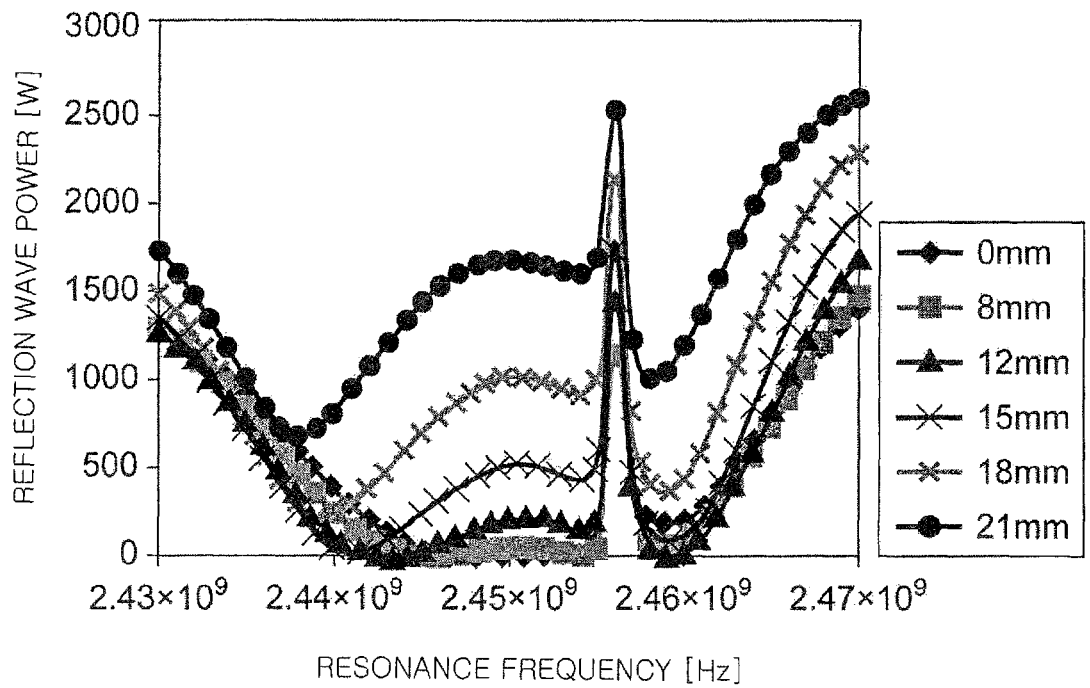

FIG. 4B shows a result of simulating the relation between the resonance frequency and the reflection wave power on a stub insertion basis at the electron density ne of $9.0 \times 10^{10}$ (1/cm$^3$). The vertical axis indicates the reflection wave power [W] and the horizontal axis indicates the resonance frequency [Hz]. As can be seen from FIG. 4B, as the stub insertion length is increased, the resonance frequency at which the reflection wave power becomes minimum is shifted to the left side.

Figure 5A:
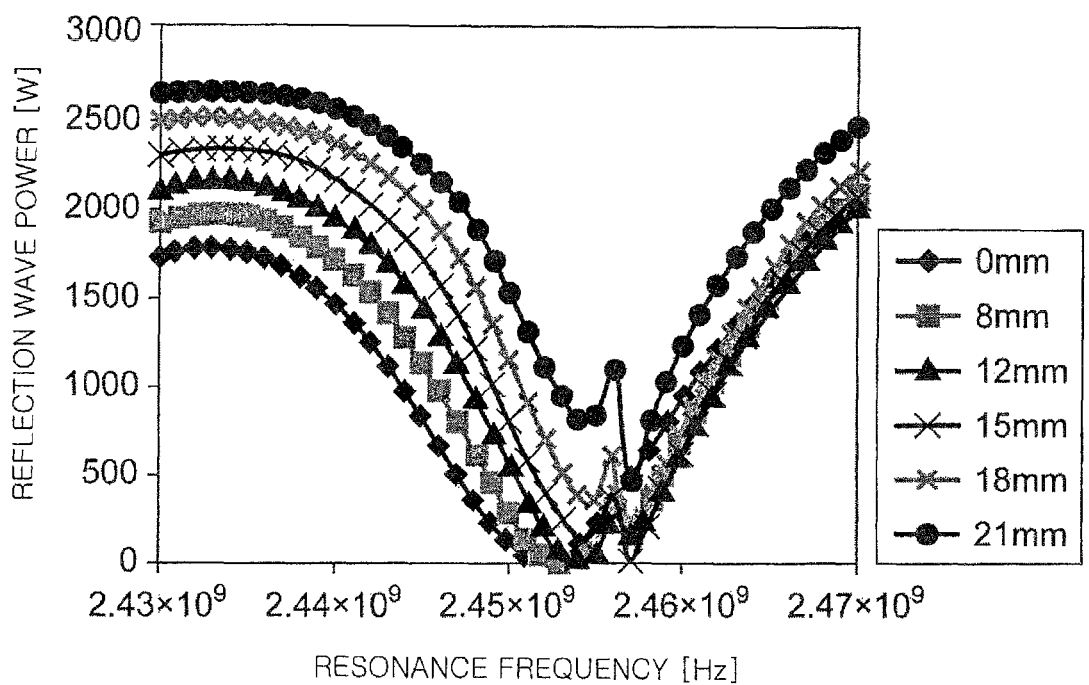
FIGS. 5A and 5B show results of simulating the relation between the resonance frequency and the reflection wave power on the stub insertion length basis.

FIG. 5A shows a result of simulating the relation between the resonance frequency and the reflection wave power on a stub insertion basis at the electron density ne of $10 \times 10^{10}$ (1/cm$^3$). The vertical axis indicates the reflection wave power [W] and the horizontal axis indicates the resonance frequency [Hz]. As can be seen from FIG. 5A, as the stub insertion length is increased, the resonance frequency at which the reflection wave power becomes minimum is shifted to a right side.

Figure 5B:
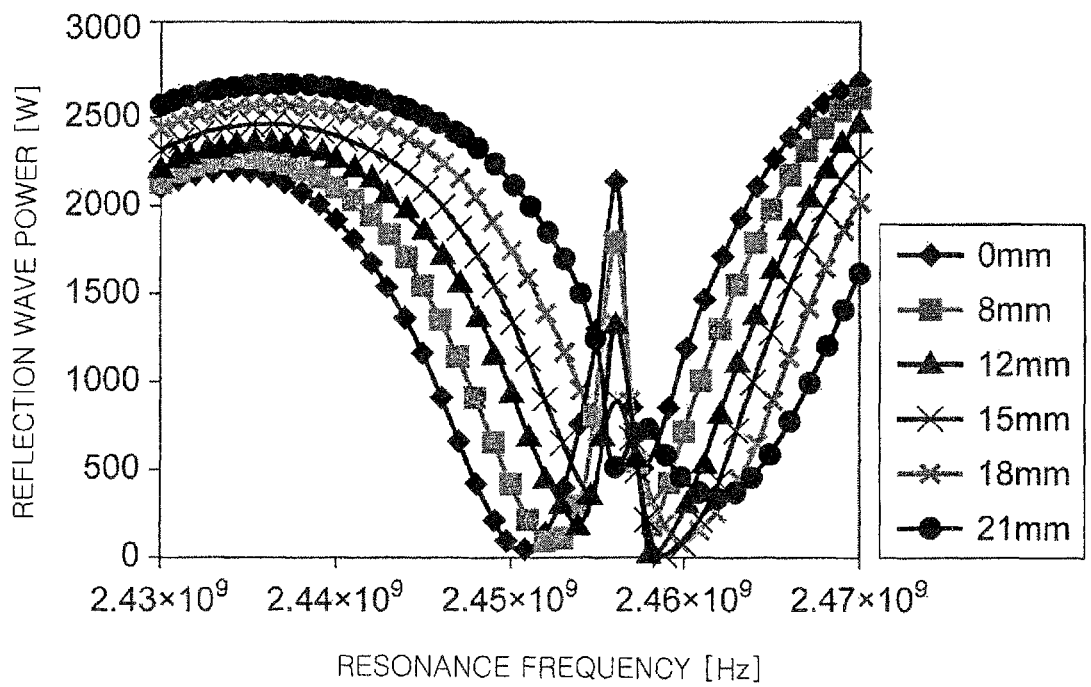

FIG. 5B shows a result of simulating the relation between the resonance frequency and the reflection wave power on a stub insertion basis at the electron density ne of $20\times10^{10}$ (1/cm$^3$). The vertical axis indicates the reflection wave power [W] and the horizontal axis indicates the resonance frequency [Hz]. As can be seen from FIG. 5B, as the stub insertion length is increased, the resonance frequency at which the reflection wave power becomes minimum is shifted to the right side.

Figure 6A:
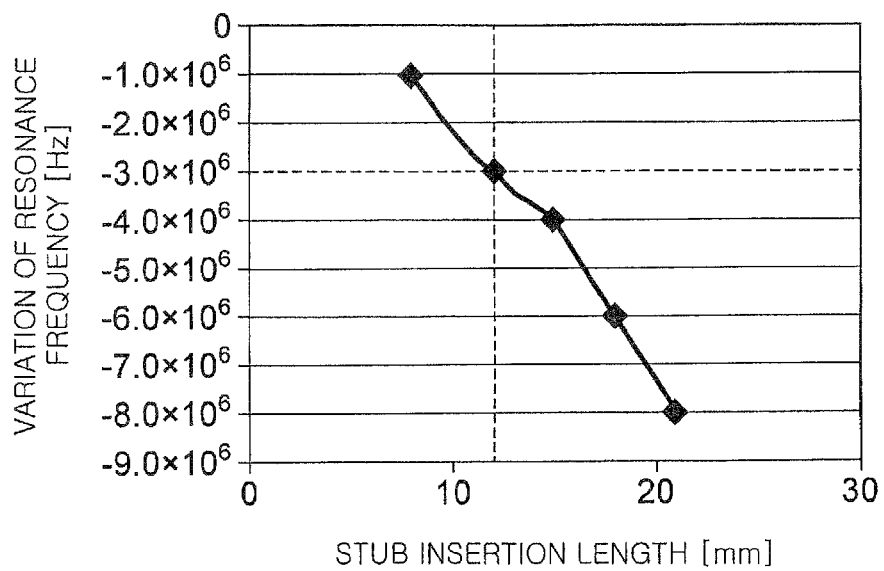
FIGS. 6A and 6B are graphs in which the simulation results of FIGS. 4A and 4B are expressed as the relation between the stub insertion length and the resonance frequency at which the reflection wave power becomes minimum.

FIG. 6A is a graph in which the simulation result of FIG. 4A is expressed as the relation between the stub insertion length and the resonance frequency at which the reflection wave power becomes minimum. The vertical axis in FIG. 6A indicates a resonance frequency [Hz] at which a reflection wave power becomes minimum with respect to a reference frequency at which a reflection wave power becomes minimum in the case of setting the stub insertion length to zero. In other words, the vertical axis indicates variation of the resonance frequency at which the reflection wave power becomes minimum in the case of setting the stub insertion length to zero. The horizontal axis in FIG. 6A indicates the stub insertion length [mm]. As can be seen from FIG. 6A, as the stub insertion length is increased within a range from 0 mm to 12 mm (indicated by a dotted line), the resonance frequency at which the reflection wave power becomes minimum is decreased (monotonous decrease).

Figure 6B:
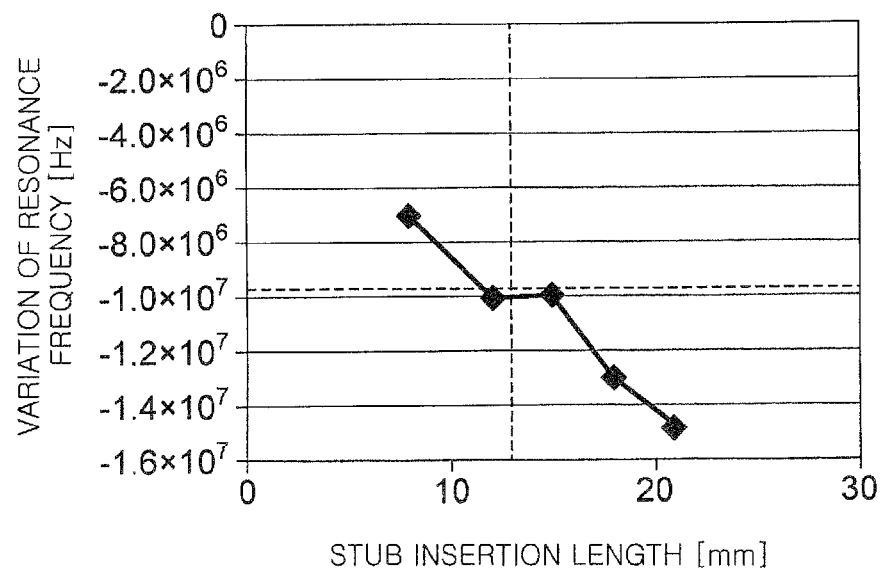

FIG. 6B is a graph in which the simulation result of FIG. 4B is expressed as the relation between the stub insertion length and the resonance frequency at which the reflection wave power becomes minimum. The vertical axis in FIG. 6B indicates a resonance frequency [Hz] at which a reflection wave power becomes minimum with respect to a reference frequency at which a reflection wave power becomes minimum in the case of setting the stub insertion length to zero. In other words, the vertical axis indicates variation of the resonance frequency at which the reflection wave power becomes minimum in the case of setting the stub insertion length to zero. The horizontal axis in FIG. 6B indicates the stub insertion length [mm]. As can be seen from FIG. 6B, as the stub insertion length is increased within a range from 0 mm to 12 mm (indicated by a dotted line), the resonance frequency at which the reflection wave power becomes minimum is decreased (monotonous decrease).

Figure 7A:
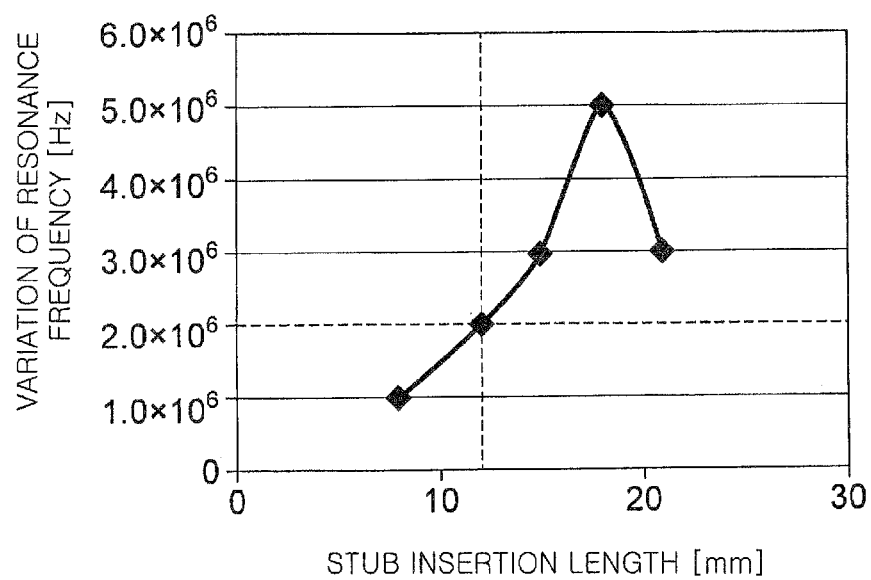
FIGS. 7A and 7B are graphs in which the simulation results of FIGS. 5A and 5B are expressed as the relation between the stub insertion length and the resonance frequency at which the reflection wave power becomes minimum.

FIG. 7A is a graph in which the simulation result of FIG. 5A is expressed as the relation between the stub insertion length and the resonance frequency at which the reflection wave power becomes minimum. The vertical axis in FIG. 7A indicates a resonance frequency [Hz] at which a reflection wave power becomes minimum with respect to a reference frequency at which a reflection wave power becomes minimum in the case of setting the stub insertion length to zero. In other words, the vertical axis indicates the variation of the resonance frequency at which the reflection wave power becomes minimum in the case of setting the stub insertion length to zero. The horizontal axis in FIG. 7A indicates the stub insertion length [mm]. As can be seen from FIG. 7A, as the stub insertion length is increased within a range from 0 mm to 12 mm (indicated by a dotted line), the resonance frequency at which the reflection wave power becomes minimum is increased (monotonous increase).

Figure 7B:
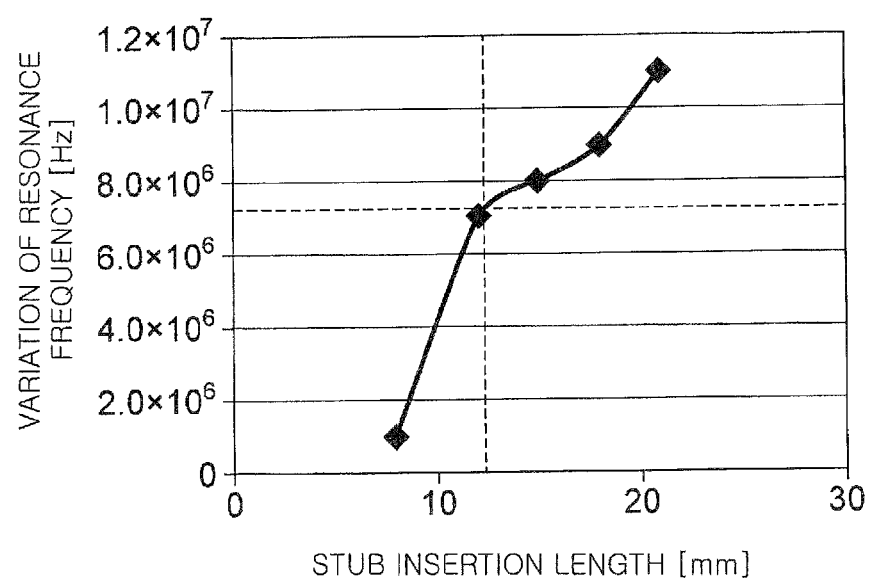

FIG. 7B is a graph in which the simulation result of FIG. 5B is expressed as the relation between the stub insertion length and the resonance frequency at which the reflection wave power becomes minimum. The vertical axis in FIG. 7B indicates a resonance frequency [Hz] at which a reflection wave power becomes minimum with respect to a reference frequency at which a reflection wave power becomes minimum in the case of setting the stub insertion length to zero. In other words, the vertical axis indicates the variation of the resonance frequency at which the reflection wave power becomes minimum in the case of setting the stub insertion length to zero. The horizontal axis in FIG. 7B indicates the stub insertion length [mm]. As can be seen from FIG. 7B, as the stub insertion length is increased within a range from 0 mm to 12 mm (indicated by a dotted line), the resonance frequency at which the reflection wave power becomes minimum is increased (monotonous increase).

As can be seen from FIGS. 6A and 6B, at a low electron density (ne=$8.0\times10^{10}$ (1/cm$^3$) to $9.0\times10^{10}$(1/cm$^3$)), the resonance frequency at which the reflection wave power becomes minimum tends to be decreased as the stub insertion length is increased within a range from 0 mm to 12 mm. As can be seen from FIGS. 7A and 7B, at a high electron density (ne=$10\times10^{10}$(1/cm$^3$) to $20\times10^{10}$ (1/cm$^3$)), the resonance frequency at which the reflection wave power becomes minimum tends to be increased as the stub insertion length is increased within a range from 0 mm to 12 mm.

Figure 8:
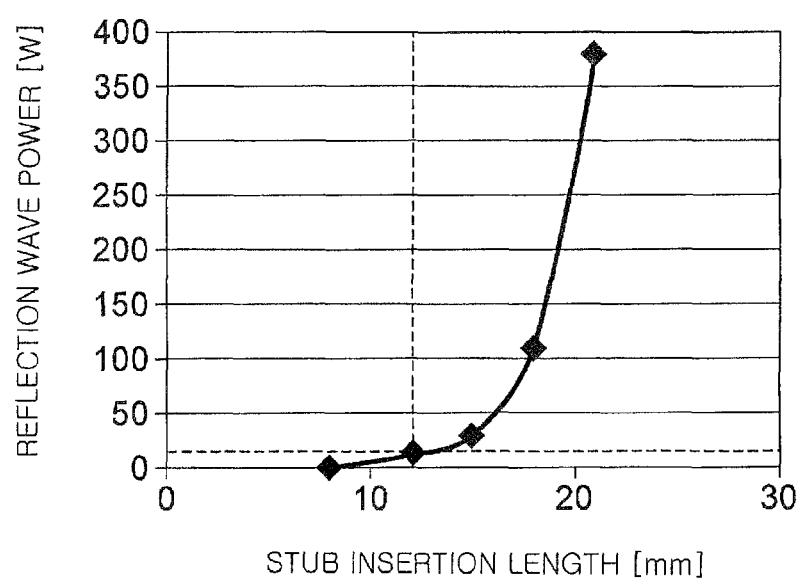
FIG. 8 shows a result of simulating the relation between the reflection wave power and the stub insertion length.

Next, the relation between the reflection wave power and the stub insertion length was simulated. In FIG. 8 showing the result of the simulation, the vertical axis indicates the reflection wave power [W] and the horizontal axis indicates the stub insertion length [mm]. The average of the reflection wave powers at the electron density ne of $8.0\times10^{10}$ (1/cm$^3$), $9.0\times10^{10}$ (1/cm$^3$), $10\times10^{10}$ (1/cm$^3$) and $20\times10^{10}$ (1/cm$^3$) was plotted. When the stub insertion length was within the range (0 mm to 12 mm) at which the monotonous decrease and the monotonous increase were monitored, the reflection wave power was about 10 W at most and within the tolerable range.

Next, a microwave control method using the characteristics of the resonance frequency control unit 29 which have been examined by the above-described simulations will be explained. In the microwave control method, an apparatus state at the time of initial introduction of the apparatus or at the time of completion of the maintenance such as exchange of the ceiling plate or the like is set to a reference apparatus state and compared with a current apparatus state. The resonance frequency control unit 29 operates when a change is detected as a result of comparison.

Figure 9:
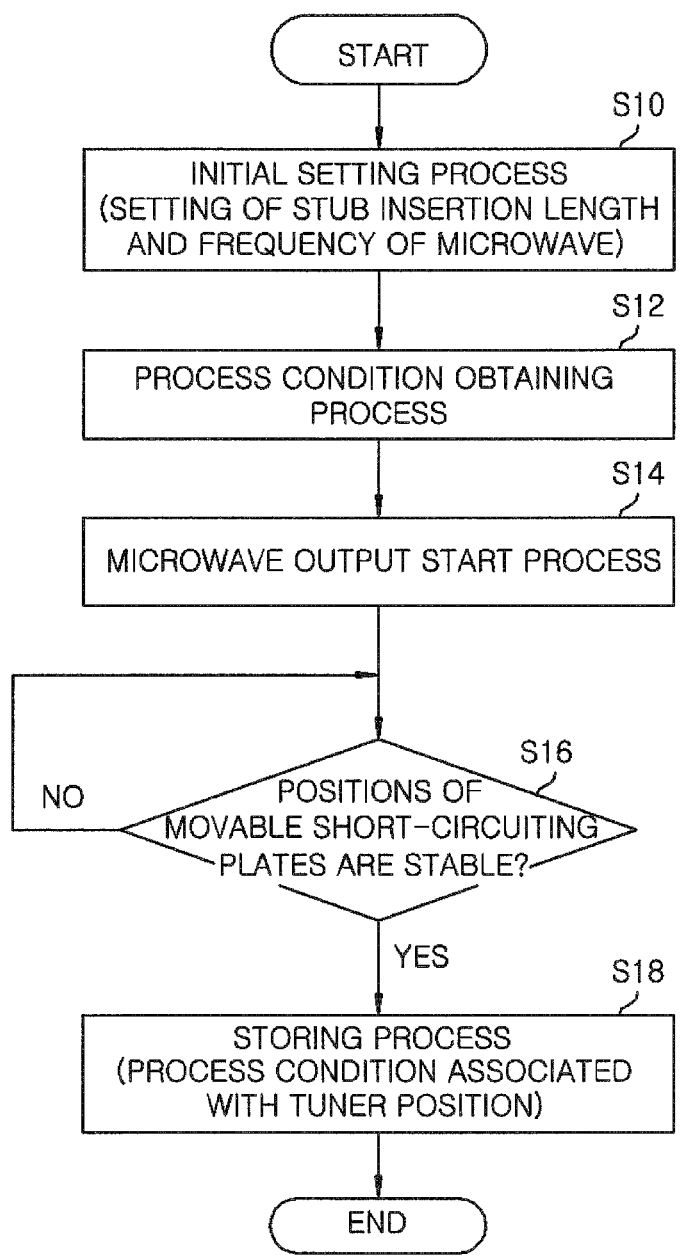
FIG. 9 is a flowchart showing a process of obtaining an initial tuner position.

In the microwave control method, first, information of an apparatus as a reference is obtained. FIG. 9 is a flowchart showing a process of obtaining an initial tuner position. The process of the flowchart shown in FIG. 9 may be executed at the time of the initial introduction of the plasma processing apparatus 1 or at the time of completion of the maintenance of the apparatus 1. The process of the flowchart is executed by the controller 100.

As shown in FIG. 9, first, the controller 100 sets a stub insertion length and a frequency of a microwave in an initial setting process S10. For example, the controller 100 sets the stub insertion length to 0 [mm] and the frequency of the microwave to 2450 [MHz]. If a stub insertion length at the time of completion of a previous maintenance is stored in the storage unit, the controller 100 may use the stub insertion length stored in the storage unit. The frequency of the microwave has a fixed value.

Next, the controller 100 obtains a process condition in a process condition obtaining process S12. For example, the controller 100 obtains a process condition by reading out a process recipe stored in the storage unit.

Next, the controller 100 starts output of the microwave in a microwave output start process S14. For example, the controller 100 output the microwave based on the process condition obtained by the process condition obtaining process S12. At this time, the tuner 26 operates the movable short-circuiting plates S1 to S4 to perform impedance matching automatically. The controller 100 determines whether or not the impedance matching is completed in a determination process S16. For example, the controller 100 determines whether or not the positions of the movable short-circuiting plates are stable. The determination is repeated until the positions of the movable short-circuiting plates become stable. The stable positions of the movable short-circuiting plates indicate that the detected positions of the movable short-circuiting plates are within a range of ±0.1 mm for three seconds consecutively (sampling interval of, e.g., 0.1 sec). The process of the flowchart shown in FIG. 9 may be completed by providing a threshold of timeout in consideration of the case in which the determination process S16 is looped.

Upon completion of the impedance matching, in a storing process S18, the controller 100 stores, in the storage unit, the process condition obtained in the process condition obtaining process S12 in association with the position (tuner position) of the movable short-circuiting plate after the impedance matching. For example, the controller 100 may manage ID of the process condition and the tuner position in the form of a table. In the storing process S18, the apparatus state at the time of completion of the maintenance (tuner position with respect to a predetermined process condition) is stored. The stored tuner position is an initial tuner position and serves as a reference for determining whether or not the resonance frequency control unit 29 needs to be operated. When the storing process S18 is completed, the process of the flowchart shown in FIG. 9 is completed.

The controller 100 performs the process of the flowchart shown in FIG. 9 under the process conditions to be executed and stores the initial (reference) tuner position with respect to the respective process conditions.

Figure 10:
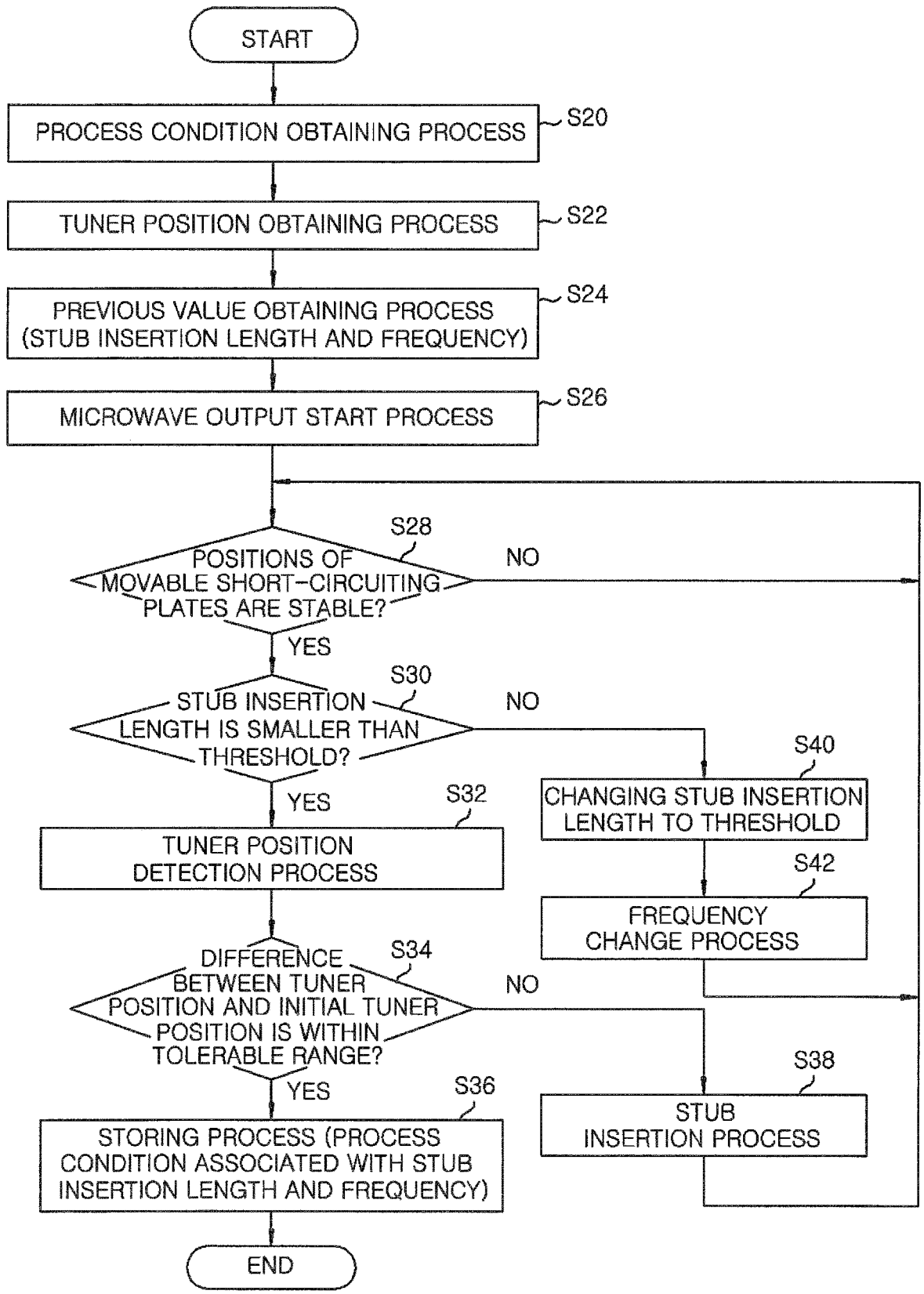
FIG. 10 is a flowchart for explaining a microwave control method based on a tuner position.

Next, the controller 100 performs the process of the flowchart shown in FIG. 10 as a microwave control method. The process of the flowchart shown in FIG. 10 may be executed at predetermined timing after the execution of the process of the flowchart shown in FIG. 9.

As shown in FIG. 10, first, the controller 100 obtains a process condition in a process condition obtaining process S20. For example, the controller 100 obtains the process condition by reading out the process recipe stored in the storage unit. The controller 100 sets a frequency of a microwave based on the process condition.

Next, the controller 100 obtains an initial tuner position in a tuner position obtaining process S22. The controller 100 obtains the initial tuner position corresponding to the process condition obtained in the process condition obtaining process S20 by referring to the storage unit.

Next, the controller 100 obtains a stub insertion length and a frequency of a microwave in a previous value obtaining process S24. As will be described later, the storage unit stores, as a history, the process condition in association with the stub insertion length and the frequency of the microwave used in the process condition. The controller 100 obtains the frequency of the microwave and the previous stub insertion length corresponding to the process condition obtained in the process condition obtaining process S20 by referring to the storage unit. In case of the first execution, the previous stub insertion length and the frequency of the microwave do not exist as the history. Therefore, initial set values (e.g., a stub insertion length of 0 [mm], a frequency of 2450 [MHz]) are employed.

Next, in a microwave output start process S26, the controller 100 controls the stub 29a to have the stub insertion length obtained in the previous value obtaining process S24 and outputs the microwave at the frequency obtained in the previous value obtaining process S24. At this time, the tuner 26 operates the movable short-circuiting plates S1 to S4 to perform impedance matching automatically. The controller 100 determines whether or not the impedance matching is completed in a determination process S28. For example, the controller 100 determines whether or not the positions of the movable short-circuiting plates are stable. The determination is repeated until the positions of the movable short-circuiting plates become stable. The stable positions of the movable short-circuiting plates indicate that the detected positions of the movable short-circuiting plates are within a range of ±0.1 mm for three seconds consecutively (sampling interval of, e.g., 0.1 sec). The process of the flowchart shown in FIG. 10 may be completed by providing a threshold of timeout in consideration of the case in which the determination process S28 is looped.

Next, the controller 100 determines whether or not the stub insertion length is smaller than a threshold in a stub insertion length determination process S30. The threshold is used for determining a limit of the stub insertion length. For example, it is possible to employ a maximum value of 12 [mm] within a range of the stub insertion length (0 mm to 12 mm) which has been examined by the simulation.

When it is determined that the stub insertion length is smaller than the threshold, the controller 100 detects a current tuner position in a tuner position detection process S32 (detection step). In other words, the controller 100 detects positions (tuner positions) of the movable short-circuiting plates S1 to S4 which have been controlled by the tuner 26 for the microwave outputted by the microwave output device 16.

Next, the controller 100 determines a deviation of the tuner position from the reference position in a determination process S34 (determination step). For example, the controller 100 calculates a difference between the current tuner position and the initial tuner position obtained in the tuner position obtaining process S22 and determines whether or not the difference is within a tolerable range. For example, on the assumption that a tuner position of the movable short-circuiting plate S1 is set to $T_1$; an initial tuner position is set to $T_{INI1}$; and a tolerable value is set to $\Delta X$ (e.g., ±1 mm), when a condition $T_1 > T_{INI1} + \Delta X$ is satisfied, the controller 100 determines that the difference is not within the tolerable range. For example, on the assumption that a tuner position of the movable short-circuiting plate S3 is set to $T_3$; an initial tuner position is set to $T_{INI3}$ and a tolerable value is set to $\Delta Y$ (e.g., ±1 mm), when a condition $T_3 > T_{INI3} + \Delta Y$ is satisfied, the controller 100 determines that the difference is not within the tolerable range. The controller 100 may determine either of the tuner position $T_1$ or $T_3$. Alternatively, only when both of the tuner positions $T_1$ and $T_3$ are determined to be within the tolerable range, it may be determined that the tuner positions are within the tolerable range.

When it is determined that the current tuner position is within the tolerable range, in a storing process S36, the controller 100 stores in the storage unit the process condition obtained in the process condition obtaining process S20 in association with a current stub insertion length and a frequency of the microwave. For example, the controller 100 may manage ID of the process condition and the current stub insertion length and the frequency of the microwave in the form of a table. In the storing process S36, a current apparatus state is stored. The stored tuner position is utilized as a previous value in a next process. When the storing process S36 is completed, the process of the flowchart shown in FIG. 10 is completed.

On the other hand, when it is determined in the determination process S34 that the current tuner position is not within the tolerable range, the controller 100 controls the stub insertion length of the stub 29a in a stub insertion process S38 (control step). For example, the controller 100 inserts the stub 29a in the inner space of the waveguide 21 by a predetermined length. For example, the controller 100 inserts the stub 29a into the inner space of the waveguide 21 by 0.1 mm. Since the stub 29a is inserted, the resonance frequency needs to be increased. Therefore, in the process of the flowchart, a high electron density (ne=10×10$^{10}$ (1/cm$^3$) to 20×10$^{10}$ (1/cm$^3$)) is required as examined in the simulation. Thereafter, the determination process S28, the stub insertion length determination process S30, the tuner position detection process S32 and the determination process S34 are executed in that order. The controller 100 repeatedly executes the determination process S28, the stub insertion length determination process S30, the tuner position detection process S32 and the determination process S34 until it is determined in the determination process S24 that the difference between the reference position and the position of the movable short-circuiting plate is within the tolerable range. By controlling the stub insertion length as described above, the resonance frequency can be changed and the tuner position can be within the tolerable range.

When it is determined in the stub insertion length determination process S30 that the stub insertion length is not smaller than the threshold, the controller 100 changes the stub insertion length to a threshold in a stub insertion length fixing process S40. This threshold is the same as the threshold used in the stub insertion length determination process S30. Here, the threshold is 12 mm.

Next, the controller 100 changes the frequency of the microwave generated by the microwave output device 16 in a frequency change process S42 (change step). Then, the above-described determination process S28 is performed. As such, when the control using the stub 29a has limitation, it is possible to control the reflection wave power to be within the tolerable range by employing another approach for changing the frequency of the microwave.

In the microwave control method of the present embodiment, when the difference between the reference position and the positions of the movable short-circuiting plates S1 to S4 is not within the tolerable range, the insertion length of the stub 29a provided between the tuner 26 and the antenna 18 (length of insertion into the inner space of the waveguide) is controlled. In other words, when the tuner position is deviated from the tolerable range due to the consumption of the ceiling plate, the insertion length of the stub is controlled. Accordingly, the resonance frequency between the tuner 26 and the plasma may be deviated, which makes it possible to avoid generation of an unstable plasma. Therefore, even when a temporal change such as the consumption of the ceiling plate or the like occurs, the availability of the plasma processing apparatus 1 can be improved.

Second Embodiment

A microwave control method according to a second embodiment is the same as the microwave control method according to the first embodiment except that the difference between the current reflection wave power and the initial reflection wave power is determined instead of the difference between the current tuner position and the initial tuner position and also in that the resonance frequency control unit 29 is driven when a change is detected. Therefore, description of the same features will be omitted.

A plasma processing apparatus to which the microwave control method according to the second embodiment is applied is the same as the plasma processing apparatus 1.

In the microwave control method according to the second embodiment, as in the microwave control method according to the first embodiment, an apparatus state at the time of initial introduction of an apparatus or at the time of completion of the maintenance such as exchange of the ceiling plate or the like is set to a reference apparatus state and compared with a current apparatus state. The resonance frequency control unit 29 operates when a change is detected as a result of comparison.

Figure 11:
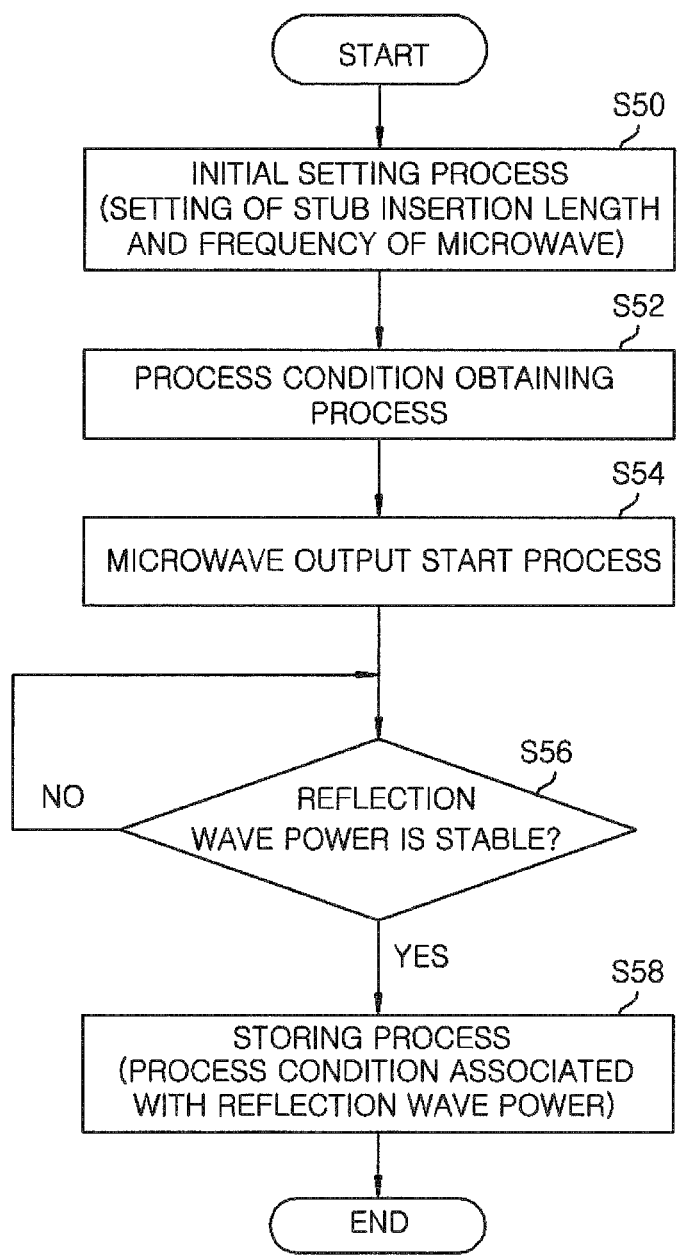
FIG. 11 is a flowchart showing a process of obtaining an initial reflection wave power by a microwave control method according to a second embodiment.

FIG. 11 is a flowchart showing a process of obtaining an initial reflection wave power. The process of the flowchart shown in FIG. 11 may be executed at the time of the initial introduction of the plasma processing apparatus 1 or at the time of completion of the maintenance for the apparatus 1, as in the case of the process of the flowchart shown in FIG. 9. The process of the flowchart is executed by the controller 100.

An initial setting process S50, a process condition obtaining process S52 and a microwave output start process S54 shown in FIG. 11 are the same as the initial setting process S10, the process condition obtaining process S12 and the microwave output start process S14 shown in FIG. 9.

The controller 100 determines whether or not the impedance matching is completed in a determination process S56. For example, the controller 100 determines whether or not the reflection wave power is stable. The determination is repeated until the reflection wave power becomes stable. The stable reflection wave power indicates that the detected reflection wave power is within a range of ±1 W for three seconds consecutively (sampling interval of, e.g., 0.1 sec). The process of the flowchart shown in FIG. 11 may be completed by providing a threshold of timeout in consideration of the case in which the determination process S16 is looped.

Upon completion of the impedance matching, in a storing process S58, the controller 100 stores, in the storage unit, the process condition obtained in the process condition obtaining process S52 in association with the reflection wave power after the impedance matching. For example, the controller 100 may manage ID of the process condition and the reflection wave power in the form of a table. In the storing process S58, the apparatus state at the time of completion of the maintenance (reflection wave power with respect to a predetermined process condition) is stored. The stored reflection wave power is an initial reflection wave power and serves as a reference (reference reflection wave power) for determining whether or not the resonance frequency control unit 29 operates. When the storing process S58 is completed, the process of the flowchart shown in FIG. 11 is completed.

The controller 100 executes the process of the flowchart shown in FIG. 11 under process conditions to be executed and stores the initial (reference) reflection wave power with respect to the respective process conditions.

Figure 12:
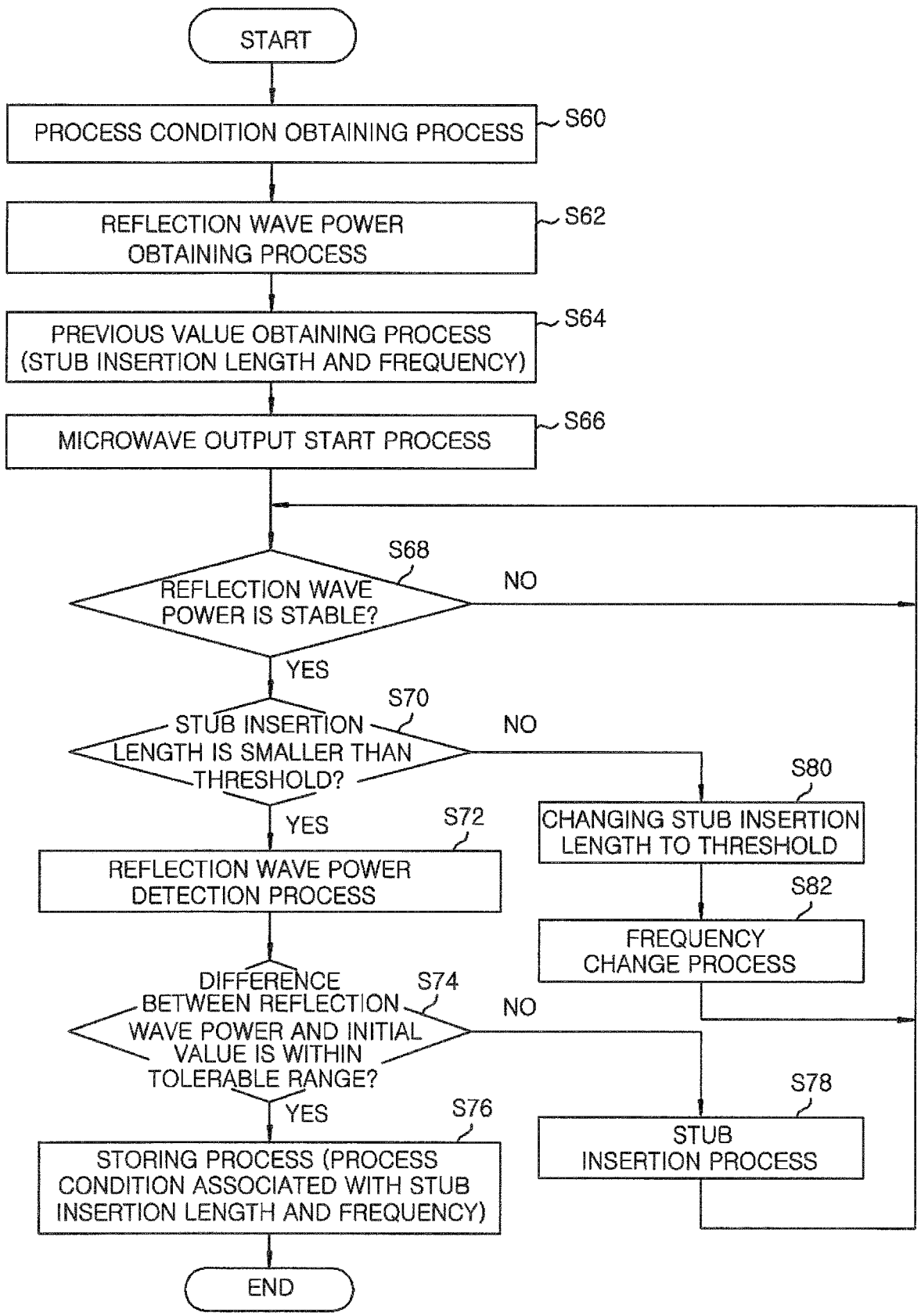
FIG. 12 is a flowchart for explaining the microwave control method according to the second embodiment.

Next, the controller 100 performs the process of the flowchart shown in FIG. 12 as a microwave control method. The process of the flowchart shown in FIG. 12 may be executed at predetermined timing after the execution of the process of the flowchart shown in FIG. 11.

First, the controller 100 performs a process condition obtaining process S60. The process condition obtaining process S60 is the same as the process condition obtaining process S20 shown in FIG. 10.

Next, the controller 100 obtains an initial reflection wave power in a reflection wave power obtaining process S62. The controller 100 obtains an initial reflection wave power corresponding to the process condition obtained in the process condition obtaining process S60 while referring to the storage unit.

Then, the controller 100 performs a previous value obtaining process S64 and a microwave output start process S66. The previous value obtaining process S64 and the microwave output start process S66 are the same as the previous value obtaining process S24 and the microwave output start process S26 shown in FIG. 10.

Thereafter, the controller 100 determines whether or not the impedance matching is completed in a determination process S68. For example, the controller 100 determines whether or not the reflection wave power is stable. The determination is repeated until the reflection wave power becomes stable. The process of the flowchart shown in FIG. 12 may be completed by providing a threshold of timeout in consideration of the case in which the determination process S68 is looped.

Next, the controller 100 executes a stub insertion length determination process S70. The stub insertion length determination process S70 is the same as the stub insertion length determination process S30 shown in FIG. 10.

When it is determined that the stub insertion length is smaller than a threshold, the controller 100 detects a current reflection wave power in a reflection wave power detection process S72 (detection step). In other words, the controller 100 detects a reflection wave power for the microwave outputted by the microwave output device 16.

Next, the controller 100 determines a deviation from a reference reflection wave power in a determination process S74 (determination step). For example, the controller 100 calculates a difference between the current reflection wave power and the initial reflection wave power obtained in the reflection wave power obtaining process S62 and determines whether or not the difference is within a tolerable range. For example, on the assumption that a reflection wave power is set to Pr; an initial reflection wave power is set to $P_{INT1}$; and a tolerable value is set to ΔPr (e.g., +10 W), when a condition Pr>$P_{INT1}$+ΔPr is satisfied, the controller 100 determines that the difference is not within the tolerable range.

When it is determined that the current reflection wave power is within the tolerable range, in a storing process S76, the controller 100 stores in the storage unit the process condition obtained in the process condition obtaining process S20 in association with a current stub insertion length and a frequency of the microwave. For example, the controller 100 may manage ID of the process condition and the current stub insertion length and the frequency of the microwave in the form of a table. In the storing process S76, a current apparatus state is stored. The stored tuner position is utilized as a previous value in a next process. When the storing process S76 is completed, the process of the flowchart shown in FIG. 12 is completed.

On the other hand, when it is determined in the determination process S74 that the current reflection wave power is not within the tolerable range, the controller 100 controls the stub insertion length of the stub 29a in a stub insertion process S78 (control step). The stub insertion process S78 is the same as the stub insertion process S38 shown in FIG. 10. Thereafter, the determination process S68, the stub insertion length determination process S70, the reflection wave power detection process S72 and the determination process S74 are executed in that order. The controller 100 repeatedly executes the determination process S68, the stub insertion length determination process S70, the reflection wave power detection process S72 and the determination process S74 until it is determined in the determination process S74 that the difference between the reference reflection wave power and the current reflection wave power is within the tolerable range. By controlling the stub insertion length as described above, the resonance frequency can be changed and the reflection wave power can be within the tolerable range.

When it is determined in the stub insertion length determination process S70 that the stub insertion length is not smaller than the threshold, the controller 100 changes the stub insertion length to a threshold in a stub insertion length fixing process S80. This threshold is the same as the threshold used in the stub insertion length determination process S70. In this case, the threshold is 12 mm.

Next, the controller 100 changes the frequency of the microwave generated by the microwave output device 16 in a frequency change process S82 (change step). Then, the above-described determination process S68 is performed. When the control using the stub 29a has limitation, it is possible to control the reflection wave power to be within the tolerable range by employing another approach for changing the frequency of the microwave.

In the microwave control method of the present embodiment, when the difference between the reference reflection wave power and the current reflection wave power is not within the tolerable range, the insertion length of the stub 29a provided between the tuner 26 and the antenna 18 (length of insertion into the inner space of the waveguide) is controlled. In other words, when the reflection wave power is deviated from the tolerable range due to the consumption of the ceiling plate, the insertion length of the stub is controlled. Accordingly, the resonance frequency between the tuner 26 and the plasma may be deviated, which makes it possible to avoid generation of an unstable plasma. Therefore, the availability of the plasma processing apparatus 1 can be improved.

Third Embodiment

A microwave control method according to a third embodiment is the same as the microwave control method according to the first embodiment except that an alarm process is performed instead of the frequency change process S42. Therefore, the same features as those of the microwave control method according to the first embodiment will be omitted.

Figure 13:
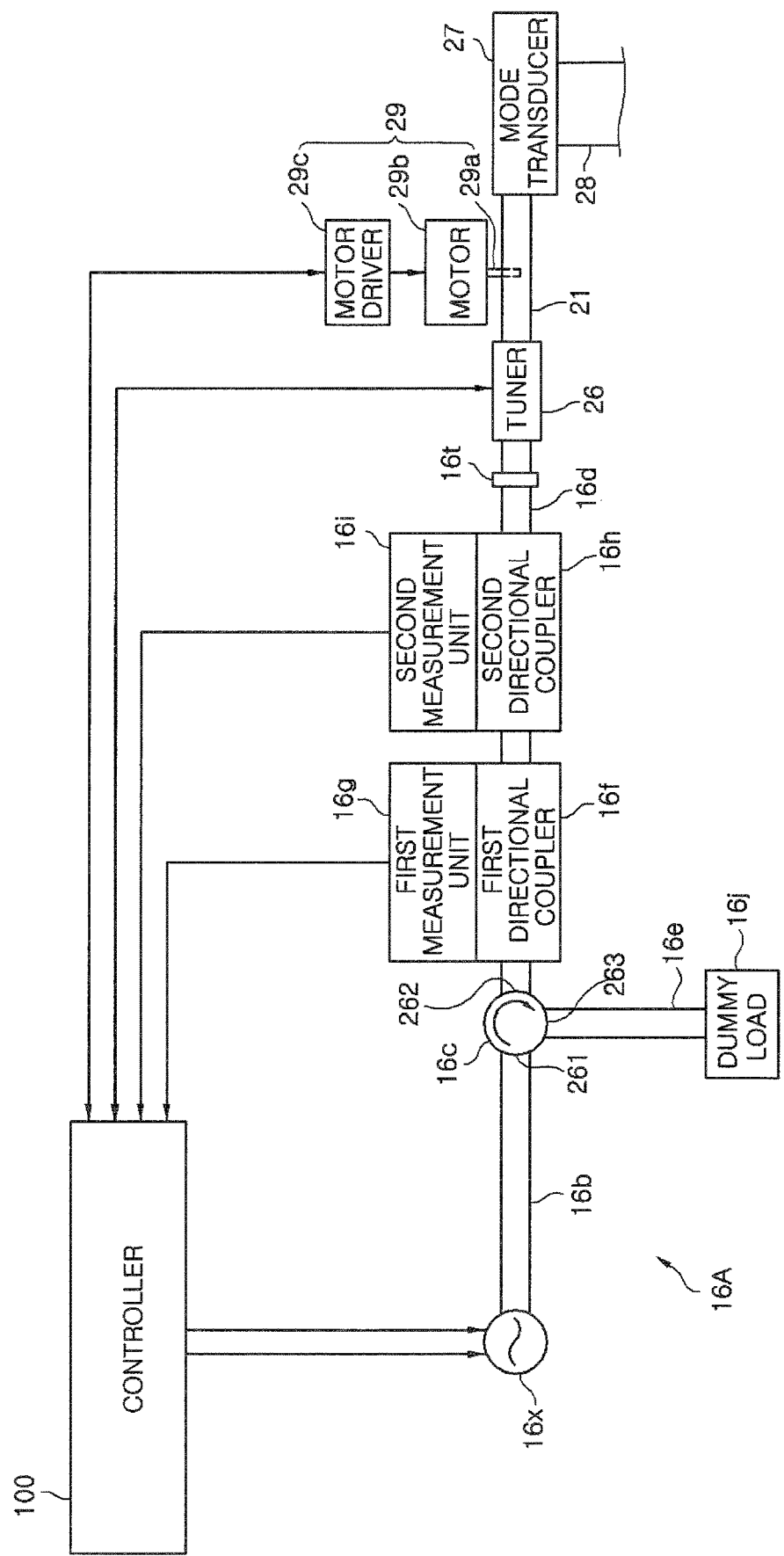
FIG. 13 shows a microwave output device, a tuner and a resonance frequency control unit to which a microwave control method according to a third embodiment is applied.

The frequency change process S42 is not performed when there is an operational demand and when there is a mechanical restriction. The operational demand includes a case in which the frequency of the microwave is fixed in consideration of an effect of reproducibility or the like. In that case, it is not appropriate to perform the frequency changing process S42 described in the first embodiment. The mechanical restriction includes a case in which a magnetron is employed as the microwave output device 16. In that case, the frequency of the microwave is resultantly determined and, thus, the frequency changing process S42 cannot be performed. FIG. 13 shows the microwave output device 16A, the tuner 26 and the resonance frequency control unit 29 to which the microwave control method according to the third embodiment is applied. As shown in FIG. 13, the microwave output device 16A includes a magnetron 16x and a controller 110x for controlling the magnetron 16x. A plasma processing apparatus to which the microwave control method according to the third embodiment is applied is the same as the plasma processing apparatus 1 except in the configuration of the microwave output device in case that there is a structural restriction. In view of an operational demand, the configuration of the apparatus is not different.

In the microwave control method according to the third embodiment, as in the microwave control method according to the first embodiment, an apparatus state at the time of initial introduction of the apparatus or at the time of completion of the maintenance such as exchange of ceiling plate or the like is set to a reference apparatus state and compared with a current apparatus state. The resonance frequency control unit 29 operates when a change is detected as a result of comparison.

Figure 14:
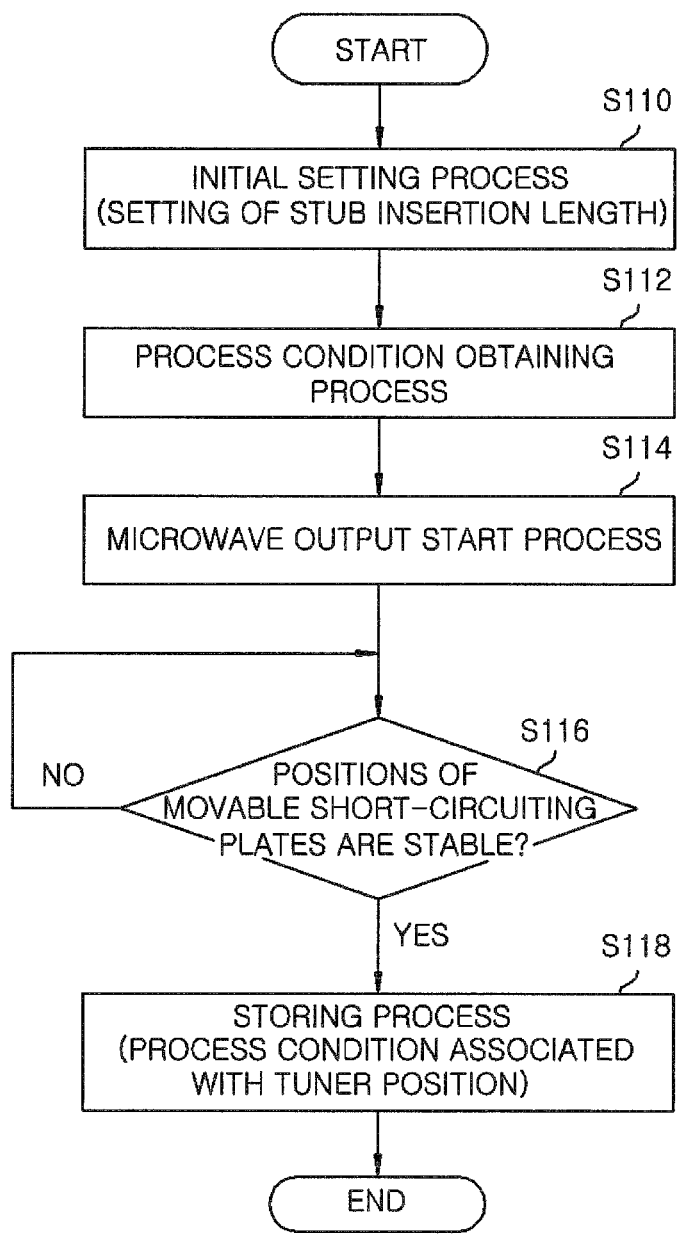
FIG. 14 is a flowchart showing a process of obtaining an initial tuner position by a microwave control method according to the third embodiment.

In the microwave control method, first, information on an apparatus as a reference is obtained. FIG. 14 is a flowchart showing a process of for obtaining an initial tuner position. The process of the flowchart shown in FIG. 14 may be executed at the time of the initial introduction of the plasma processing apparatus 1 or at the time of completion of the maintenance for the apparatus 1. The process of the flowchart is executed by a controller 100x.

As shown in FIG. 14, first, the controller 100x sets a stub insertion length in an initial setting process S110. The initial setting process S110 is the same as the initial setting process S10 shown in FIG. 9 except that the frequency of the microwave is not set.

The process condition obtaining process S112, the microwave output start process S114, the determination process S116 and the storing process S118 shown in FIG. 14 are the same as the process condition obtaining process S12, the microwave output start process S14, the determination process S16 and the storing process S18 shown in FIG. 9. In this manner, the process of the flowchart shown in FIG. 14 is completed.

The controller 100x performs the process of the flowchart shown in FIG. 14 under the process conditions to be executed and stores an initial (reference) tuner position with respect to the respective process conditions.

Figure 15:
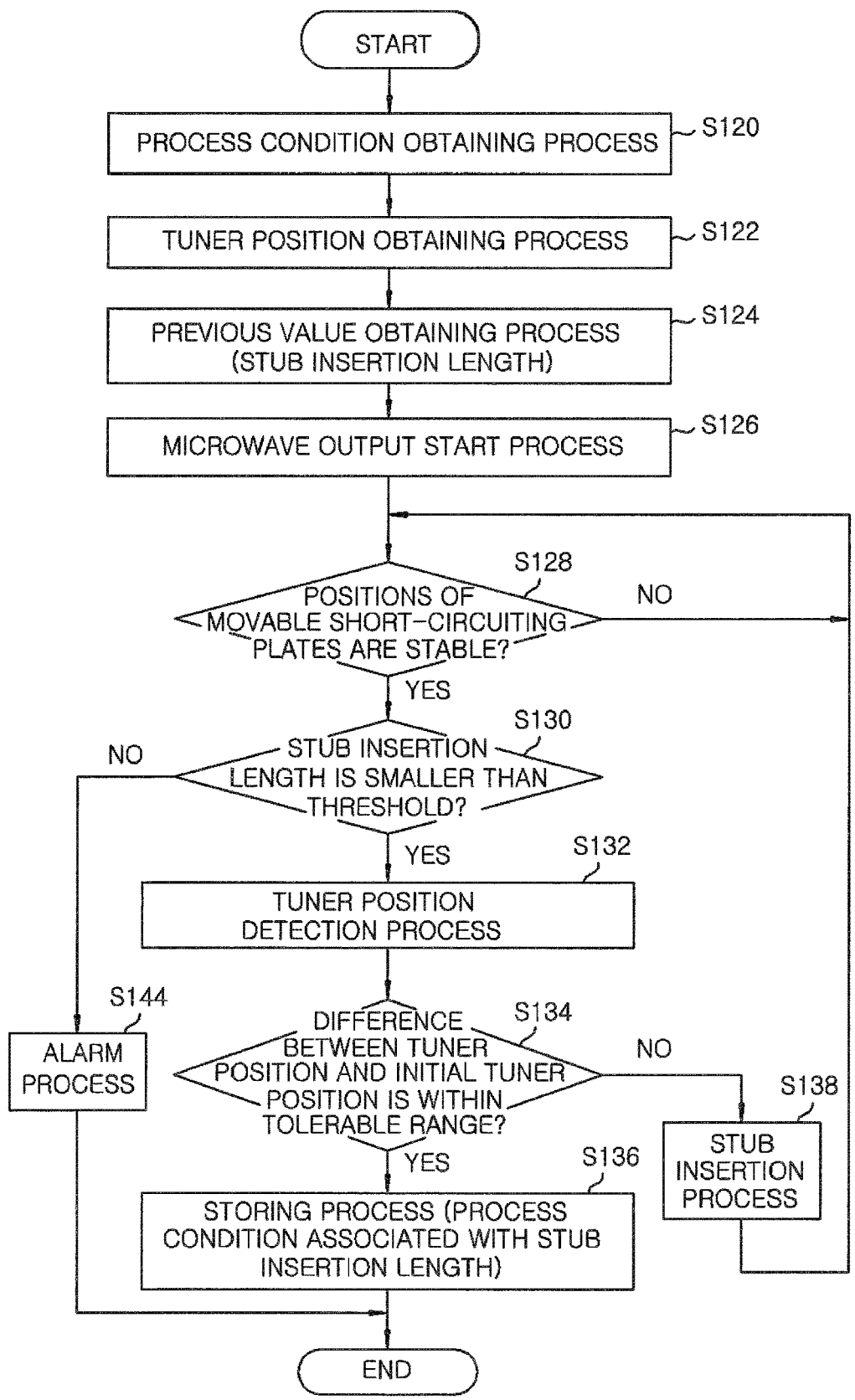
FIG. 15 is a flowchart for explaining the microwave control method according to the third embodiment.

Next, the controller 100x performs the process of the flowchart shown in FIG. 15 as a microwave control method. The process of the flowchart shown in FIG. 15 may be executed at predetermined timing after the execution of the process of the flowchart shown in FIG. 14.

A process condition obtaining process S120 and a tuner position obtaining process S122 shown in FIG. 15 are the same as the process condition obtaining process S20 and the tuner position obtaining process S22 shown in FIG. 10.

Then, the controller 100x obtains a stub insertion length in a previous value obtaining process S124. The previous value obtaining process S124 is the same as the previous value obtaining process S24 shown in FIG. 10 except that the frequency of the microwave is not set.

A microwave output start process S126, a determination process S128, a stub length insertion length determination process S130, a tuner position detection process S132 (detection step), a determination process S134 (determination step) and a stub insertion process S138 (control step) are the same as the microwave output start process S26, the determination process S28, the stub insertion length determination process S30, the tuner position detection process S32 (detection step), the determination process S34 (determination step) and the stub insertion process S38 (control step) shown in FIG. 10.

When it is determined that the current tuner position is within the tolerable range, in a storing process S136, the controller 100x stores, in the storage unit, a current stub insertion length in association with the process condition obtained in the process condition obtaining process S120. The storing process S139 is the same as the storing process S36 shown in FIG. 10 except that the frequency of the microwave is not set.

When it is determined in the stub insertion length determination process S130 that the stub insertion length is not smaller than a threshold, the controller 100x displays alarm information on the user interface or outputs the alarm information as sound in an alarm process S144. When the control using the stub has limitation, the maintenance operation can be promoted by outputting the alarm. Upon completion of the alarm process, the process of the flowchart shown in FIG. 15 is completed.

Fourth Embodiment

A microwave control method according to a fourth embodiment is the same as the microwave control method according to the second embodiment except that the alarm process is performed instead of the frequency change process S82. Therefore, description of the same features as those of the microwave control method according to the second embodiment will be omitted. The frequency change process S82 is not executed for the same reason as that described in the third embodiment. In other words, the configuration of the apparatus is the same as that described in the third embodiment.

In the microwave control method according to the fourth embodiment, as in the microwave control method according to the second embodiment, an apparatus state at the time of initial introduction of an apparatus or at the time of completion of the maintenance such as exchange of the ceiling plate or the like is set to a reference apparatus state and compared with a current apparatus state. The resonance frequency control unit 29 operates when a change is detected as a result of comparison.

Figure 16:
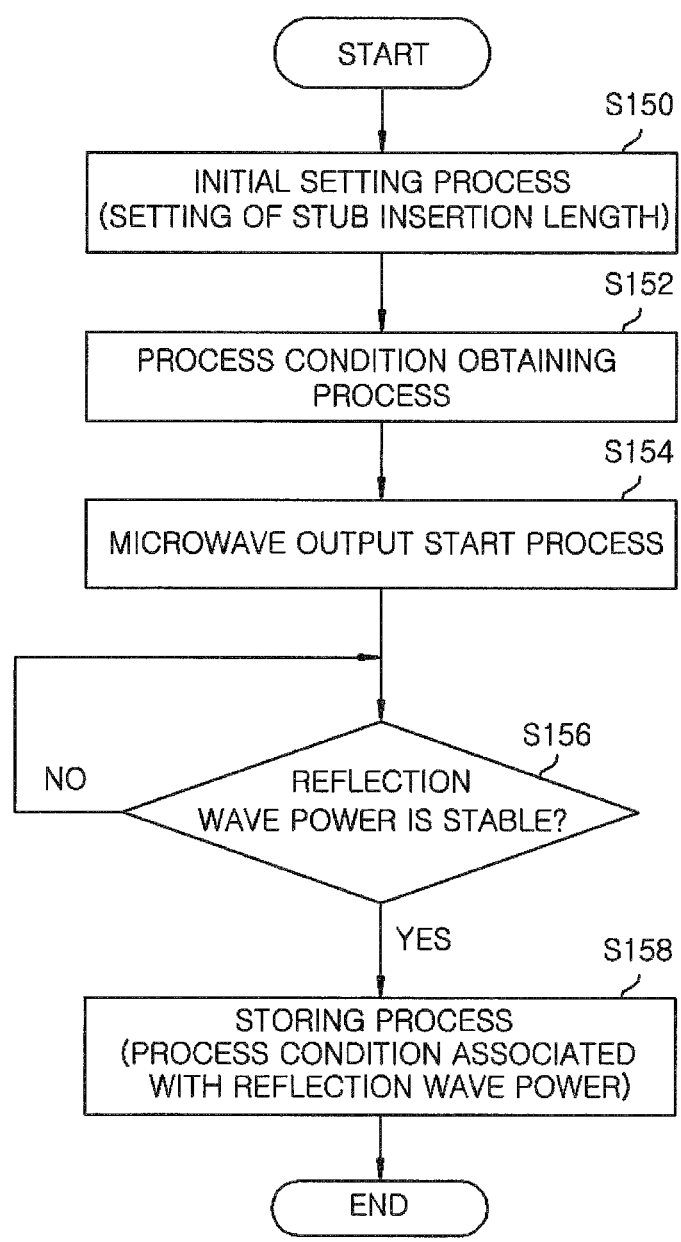
FIG. 16 is a flowchart showing a modified process of obtaining an initial reflection wave power by a microwave control method according to a fourth embodiment.

FIG. 16 is a flowchart showing a process of obtaining an initial reflection wave power. As in the case of the process of the flowchart shown in FIG. 11, the process of the flowchart shown in FIG. 16 may be executed at the time of the initial introduction of the plasma processing apparatus 1 or at the time of completion of the maintenance for the apparatus 1. The process of the flowchart is executed by the controller 100x.

As shown in FIG. 16, first, the controller 100x sets a stub insertion length in an initial setting process S150. The initial setting process S50 is the same as the initial setting process S50 shown in FIG. 11 except that the frequency of the microwave is not set.

A process condition obtaining process S152, a microwave output start process S154, a determination process S156 and a storing process S158 shown in FIG. 16 are the same as the process condition obtaining process S52, the microwave output start process S54, the determination process S56 and the storing process S58 shown in FIG. 11. In this manner, the process of the flowchart shown in FIG. 16 is completed.

The controller 100x executes the process of the flowchart shown in FIG. 16 under process conditions to be executed and stores the initial (reference) reflection wave power with respect to the respective process conditions.

Figure 17:
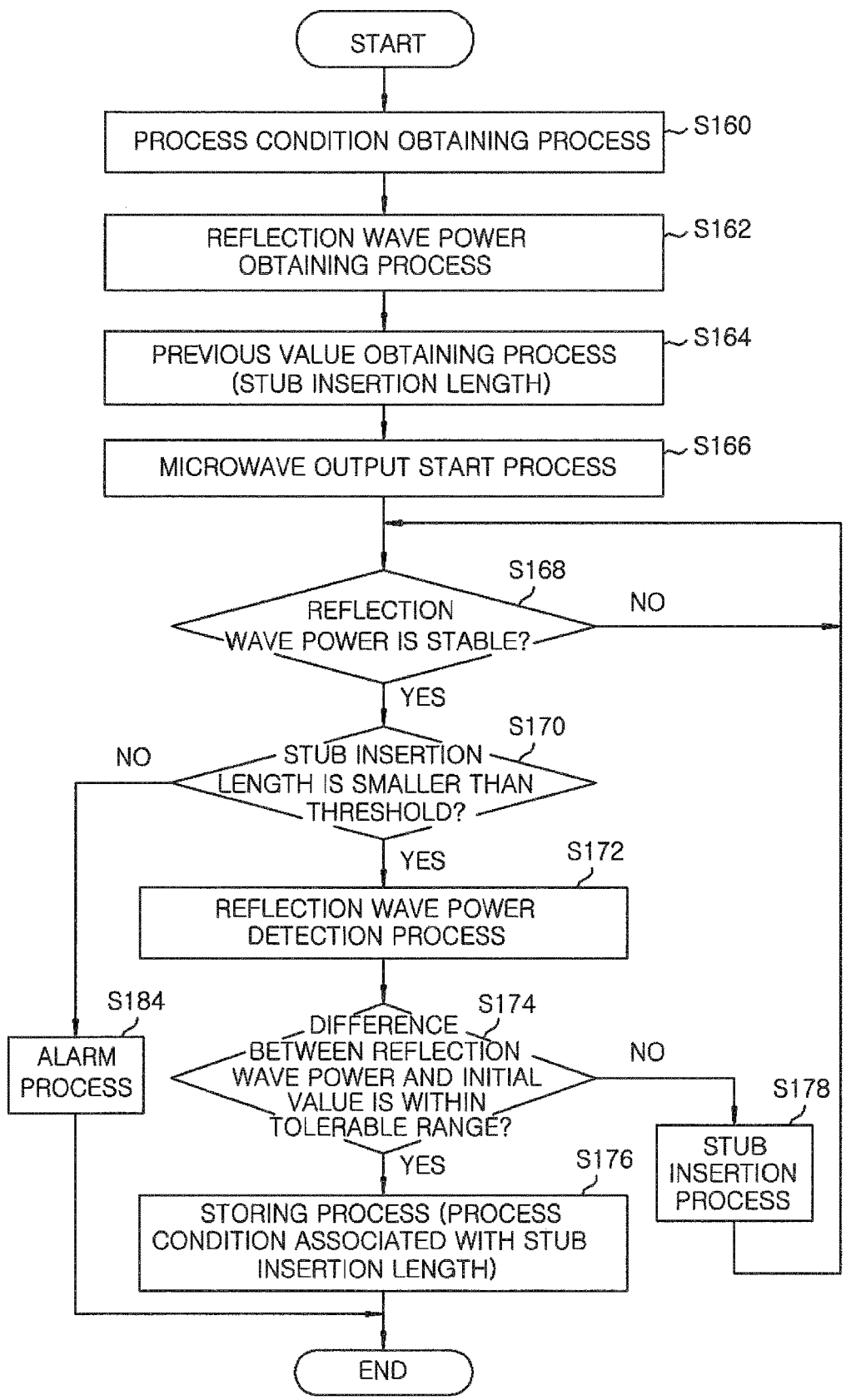
FIG. 17 is a flowchart for explaining the microwave control method according to the fourth embodiment.

Next, the controller 100 performs the process of the flowchart shown in FIG. 17 as a microwave control method. The process of the flowchart shown in FIG. 17 may be executed at predetermined timing after the execution of the process of the flowchart shown in FIG. 16.

A process condition obtaining process S160 and a reflection wave power obtaining process S162 shown in FIG. 17 are the same as the process condition obtaining process S20 and the reflection wave power obtaining process S62 shown in FIG. 12.

Next, the controller 100x obtains a stub insertion length in a previous value obtaining process S164. The previous value obtaining process S164 is the same as the previous value obtaining process S64 shown in FIG. 12 except that the frequency of the microwave is not set.

A microwave output start process S166, a determination process S168, a stub insertion length determination process S170, a reflection wave power detection process S172 (detection step), a determination process S174 (determination step) and a stub insertion process S178 (control step) are the same as the microwave output start process S66, the determination process S68, the stub insertion length determination process S70, the reflection wave power detection process S72 (detection step), the determination process S74 (determination step) and the stub insertion process S78 (control step) shown in FIG. 12.

When it is determined that the current reflection wave power is within the tolerable range, in the storing process S176, the controller 100x stores, in the storage unit, a current stub insertion length in association with the process condition obtained in the process condition obtaining process S160. The storing process S176 is the same as the storing process S76 shown in FIG. 12 except that the frequency of the microwave is not set.

On the other hand, when it is determined in the stub insertion length determination process S170 that the stub insertion length is not smaller than a threshold value, the controller 100x displays alarm information on the user interface or outputs the alarm information as sound in an alarm process S184. As such, when the control using the stub has limitation, the maintenance operation can be promoted by outputting the alarm. Upon completion of the alarm process, the process of the flowchart shown in FIG. 15 is completed.

While various embodiments have been described, the present disclosure may be variously modified without being limited to the above-described embodiments. For example, the respective embodiments may be combined. For example, although the case in which the insertion length is controlled to a positive side has been described in the above embodiments, the insertion length may be controlled to a negative side. Such control may be appropriately changed based on the characteristics (monotonous decrease and monotonous increase) examined by the simulation. The stub may be replaced with the movable short-circuiting plate. The movable short-circuiting plate may be replaced with the stub.

While the disclosure has been shown and described with respect to the embodiments, it will be understood by those skilled in the art that various changes and modifications may be made without departing from the scope of the disclosure as defined in the following claims.

What is claimed is:

1. A microwave control method in a microwave plasma processing apparatus including a microwave generation unit configured to generate a microwave having a power corresponding to a set power, a waveguide configured to guide the microwave generated by the microwave generation unit to an antenna of a chamber main body, a tuner provided in the waveguide and configured to control a position of a movable short-circuiting plate such that an impedance of the microwave generation unit side is matched with an impedance of the antenna side, and a stub provided between the tuner and the antenna in the waveguide and insertable into an inner space of the waveguide, the method comprising:
    detecting the position of the movable short-circuiting plate which is controlled by the tuner for the microwave outputted by the microwave generation unit;
    determining whether or not a difference between a reference position and the detected position of the movable short-circuiting plate is within a tolerable range; and
    controlling an insertion length of the stub into the inner space of the waveguide when it is determined that the difference between the position of the movable short-circuiting plate and the reference position is not within the tolerable range.

2. The microwave control method of claim 1, wherein in said controlling the insertion length, the stub is inserted into the inner space of the waveguide by a predetermined length, and
    said controlling the insertion length, said detecting the position of the movable short-circuiting plate and said determining whether or not the difference is within the tolerable range are repeatedly executed until it is determined that the difference between the position of the movable short-circuiting position and the reference position is within the tolerable range.

3. The microwave control method of claim 2, wherein the microwave generation unit is configured to change a frequency of the microwave, the method further comprising:
    changing the insertion length of the stub to a threshold and changing the frequency of the microwave generated by the microwave generation unit when it is determined that the difference between the position of the movable short-circuiting plate and the reference position is not within the tolerable range and when the controlled insertion length of the stub which is not smaller than the threshold.

4. The microwave control method of claim 2, further comprising:
    stopping the repeated execution of said controlling the insertion length, said detecting the position and said determining whether or not the difference is within the tolerable range and outputting alarm when it is determined that the difference between the position of the movable short-circuiting plate and the reference position is not within the tolerable range and when the controlled insertion length of the stub is not smaller than the threshold.

5. A microwave control method in a microwave plasma processing apparatus including a microwave generation unit configured to generate a microwave having a power corresponding to a set power, a waveguide configured to guide the microwave generated by the microwave generation unit to an antenna of a chamber main body, a tuner provided in the waveguide and configured to control a position of a movable short-circuiting plate such that an impedance of the microwave generation unit side is matched with an impedance of the antenna side, and a stub provided between the tuner and the antenna in the waveguide and insertable into an inner space of the waveguide, the method comprising:
    detecting a reflection wave power of the microwave outputted by the microwave generation unit;

determining whether or not a difference between a reference reflection wave power and the detected reflection wave power is within a tolerable range; and controlling an insertion length of the stub into the inner space of the waveguide when it is determined that the difference between the reference reflection wave power and the detected reflection wave power is not within the tolerable range.

6. The microwave control method of claim 5, wherein in said controlling the insertion length, the stub is inserted into the inner space of the waveguide by a predetermined length and said controlling the insertion length, said detecting the position and said determining whether or not the difference is within the tolerable range are repeatedly executed until it is determined that the difference between the reflection wave power and the reference reflection wave power is within the tolerable range.

7. The microwave control method of claim 6, wherein the microwave generation unit is configured to change a frequency of the microwave, the method further comprising:

changing the insertion length of the stub to a threshold and changing the frequency of the microwave generated by the microwave generation unit when it is determined that the difference between the position of the movable short-circuiting plate and the reference position is not within the tolerable range and when the controlled insertion length of the stub is not smaller than the threshold.

8. The microwave control method of claim 6, further comprising:

stopping the repeated execution of said controlling the insertion length, said detecting the position and said determining whether or not the difference is within the tolerable range and outputting alarm when it is determined that the difference between the position of the movable short-circuiting plate and the reference position is not within the tolerable range and when the controlled insertion length of the stub is not smaller than the threshold.

* * * * *